United States Patent
Kawahara et al.

(10) Patent No.: US 9,263,777 B2
(45) Date of Patent: Feb. 16, 2016

(54) SEMICONDUCTOR DEVICE, BATTERY PACK, AND ELECTRONIC DEVICE

(71) Applicant: Renesas Electronics Corporation, Kawasaki-shi, Kanagawa (JP)

(72) Inventors: Youhei Kawahara, Tokyo (JP); Kenta Kobayashi, Kanagawa (JP); Suguru Sasaki, Kanagawa (JP); Yusuke Sugawara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 237 days.

(21) Appl. No.: 14/103,805

(22) Filed: Dec. 11, 2013

(65) Prior Publication Data

US 2014/0177145 A1    Jun. 26, 2014

(30) Foreign Application Priority Data

Dec. 13, 2012    (JP) ................................ 2012-272178

(51) Int. Cl.

| | |
|---|---|
| H02J 7/00 | (2006.01) |
| H01M 10/44 | (2006.01) |
| G01R 31/36 | (2006.01) |
| H01M 10/48 | (2006.01) |

(52) U.S. Cl.
CPC ......... *H01M 10/441* (2013.01); *G01R 31/3624* (2013.01); *G01R 31/3651* (2013.01); *H01M 10/443* (2013.01); *H01M 10/482* (2013.01); *H01M 10/486* (2013.01); *H02J 7/0047* (2013.01); *H02J 2007/005* (2013.01)

(58) Field of Classification Search
CPC ....................... G01R 31/3624; H02J 2007/005
USPC ........ 320/127, 132, 134, 136; 429/61; 702/63
See application file for complete search history.

(56) References Cited

U.S. PATENT DOCUMENTS

| | | | | |
|---|---|---|---|---|
| 2011/0161025 A1* | 6/2011 | Tomura | .............. | G01R 31/3651 702/63 |
| 2013/0090871 A1* | 4/2013 | Akabori | .................. | G06F 17/00 702/63 |

FOREIGN PATENT DOCUMENTS

| | | |
|---|---|---|
| JP | 05-087896 A | 4/1993 |
| JP | 2006-177764 A | 7/2006 |

* cited by examiner

*Primary Examiner* — Edward Tso
*Assistant Examiner* — Aaron Piggush
(74) *Attorney, Agent, or Firm* — Shapiro, Gabor and Rosenberger, PLLC

(57) ABSTRACT

A semiconductor device generates battery state information including information of a capacity that can be extracted from a battery in the case of discharging from a full charge state until a discharge cutoff voltage at a predetermined discharge rate, based on measurement results of battery voltage, current, and temperature. The device calculates a first estimate value of capacity that can be extracted in the case of discharging the battery from the full charge state until the discharge cutoff voltage and calculates a second estimate value of capacity that can be extracted in the case of discharging the battery until a voltage larger than the discharge cutoff voltage. The device corrects the first estimate value based on a difference between a capacity value extracted from the battery by discharging the battery from the full charge state until the voltage larger than the discharge cutoff voltage and the second estimate value.

13 Claims, 11 Drawing Sheets

SEMICONDUCTOR DEVICE, BATTERY PACK, AND ELECTRONIC DEVICE

CROSS-REFERENCE TO RELATED APPLICATIONS

The disclosure of Japanese Patent Application No. 2012-272178 filed on Dec. 13, 2012 including the specification, drawings and abstract is incorporated herein by reference in its entirety.

BACKGROUND

The present invention relates to a semiconductor device, a battery pack, and an electronic device, and particularly to a technique effectively applied to a semiconductor device for monitoring the state of a secondary battery.

It is necessary to inform a user of information indicating a battery state in the case of using a secondary battery as a power source for an electronic device such as a notebook computer. The information indicating the battery state includes information (Full Charge Capacity: FCC) indicating a capacity that can be extracted from the secondary battery in the case of discharging the secondary battery from a full charge state until a discharge cutoff voltage at a predetermined discharge rate, information (Remaining Capacity: RC) indicating the remaining capacity of the battery, and information (State of Charge: SOC) indicating the charge state of the battery. Accordingly, the electronic device incorporates the secondary battery and a state detection circuit for detecting the state of the secondary battery and outputting it to the outside, and the state information of the secondary battery detected by the state detection circuit is displayed on a display device such as an LCD (Liquid Crystal Display) and is used to determine whether or not to restrict the use of the secondary battery. For example, the following Patent Documents 1 and 2 disclose related arts for detecting the state of the battery.

Japanese Unexamined Patent Publication No. 2006-177764 (Patent Document 1) discloses a learning capacity correction method of a battery for, at the time of fully charging the battery from a predetermined charge start remaining capacity, detecting a charge capacity from the charge start remaining capacity to the full charge capacity, detecting an addition capacity obtained by adding the detected charge capacity to the charge start remaining capacity, comparing the detected addition capacity with the previous learning capacity, and using the addition capacity as the learning capacity if the difference between the addition capacity and the learning capacity exceeds a set error.

Japanese Unexamined Patent Publication No. Hei 5 (1993)-87896 (Patent Document 2) discloses a battery remaining-capacity detection/correction method in which there is provided a battery remaining-capacity correction unit for correcting a battery remaining-capacity calculation value obtained from a cumulative value of a consumption current from the battery based on an actual battery remaining capacity at a plurality of predetermined voltages of the battery, and there is displayed a value obtained by subtracting the cumulative value of the consumption current from the battery remaining-capacity calculation value corrected by the battery remaining-capacity correction unit based on the predetermined voltages.

SUMMARY

To maximize the utilization of electricity storage energy of the secondary battery, it is necessary to detect the state of the battery with high accuracy. On the other hand, the battery deteriorates with time, usage state, and the like, which increases an internal resistance and decreases the total capacity of the battery in the full charge state; accordingly, in the battery state detection, it is also necessary to respond to this characteristic change. According to the technique disclosed in Patent Document 1, it is possible to frequently correct the learning capacity of the battery to a more accurate capacity without fully discharging the battery. However, the above-described capacity correction has its limits in ensuring the accuracy of detecting the battery state. For example, the temperature information of the battery is needed in detecting the states of FCC, RC, etc., but it is difficult to obtain the accurate temperature of the battery; accordingly, the temperature information contains a measurement error, which causes errors in various results of detecting FCC, RC, etc. Further, according to the technique disclosed in Patent Document 2, it is possible to display the accurate battery remaining-capacity calculation value by correcting the battery remaining-capacity calculation value calculated from the consumption current based on the actual battery remaining capacity obtained beforehand. However, since information for ensuring the accuracy of the remaining capacity is obtained beforehand, it might be difficult to ensure the accuracy in the usage of the battery out of the condition for obtaining the information beforehand.

The present inventors have thought that there is a need for a new technique for further improving the accuracy of detecting the battery state.

While means for solving such a problem will be described below, the other problems and novel features will become apparent from the description of this specification and the accompanying drawings.

A typical one of the embodiments disclosed in the present application will be briefly described as follows.

The present semiconductor device generates battery state information including information of a capacity that can be extracted from a battery in the case of discharging the battery from a full charge state until a discharge cutoff voltage at a predetermined discharge rate, based on measurement results of a voltage, a current, a temperature of the battery. The semiconductor device calculates a first estimate value of the capacity that can be extracted in the case of discharging the battery from the full charge state until the discharge cutoff voltage and calculates a second estimate value of a capacity that can be extracted in the case of discharging the battery until a voltage larger than the discharge cutoff voltage. Further, the semiconductor device corrects the first estimate value based on a difference amount between a capacity value extracted from the battery by discharging the battery from the full charge state until the voltage larger than the discharge cutoff voltage and the second estimate value.

An effect obtained by the typical one of the embodiments disclosed in the present application will be briefly described as follows.

According to the present semiconductor device, it is possible to improve the accuracy of detecting the battery state.

DETAILED DESCRIPTION

1. Outline of Embodiments

Figure 1:
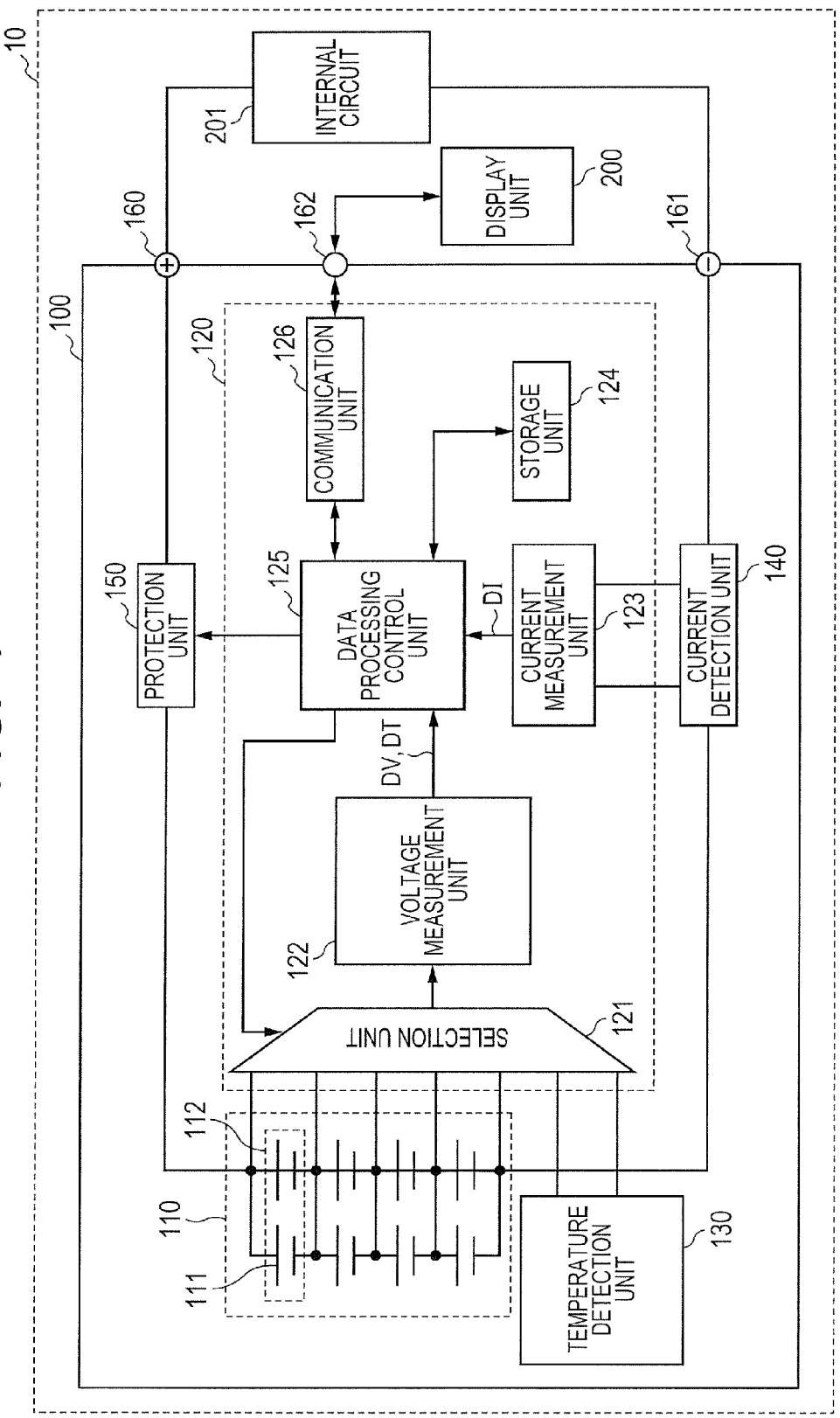
FIG. 1 is a diagram illustrating an electronic device including a battery pack incorporating a semiconductor device according to a first embodiment.

First, exemplary embodiments of the invention disclosed in the present application will be outlined. Reference numerals in the drawings that refer to with parentheses applied thereto in the outline description of the exemplary embodiments are merely illustration of ones contained in the concepts of components marked with the reference numerals.

[1] (A Semiconductor Device for Monitoring a Battery State which Corrects an Estimate Value of a Full Charge Capacity Based on a Difference Between an Estimate Value of a Capacity Value that can be Extracted in the Case of Discharging a Battery Until a Predetermined Voltage and an Actually Extracted Capacity Value)

A semiconductor device (120) according to an exemplary embodiment of the present application is a semiconductor device for monitoring a state of a battery (110, 111, 112). The semiconductor device has a voltage measurement unit (122) for measuring a voltage of the battery and a current measurement unit (123) for measuring a current of the battery. The semiconductor device further has a data processing control unit (125, 225) for generating state information indicating the state of the battery, based on measurement results of the voltage measurement unit and the current measurement unit. The data processing control unit calculates a first estimate value (FCC1st) of a capacity that can be extracted from the battery in the case of discharging the battery from a full charge state until a discharge cutoff voltage (VST), at a predetermined discharge rate and a second estimate value (FCC2nd) of a capacity that can be extracted from the battery in the case of discharging the battery until a voltage (CCV1, CCV2, CCV3) larger than the discharge cutoff voltage. Further, the data processing control unit corrects the first estimate value based on an error in the second estimate value. The error in the second estimate value is determined based on a difference amount (FCCerr) between a capacity value (FCCtrue) extracted from the battery by discharging the battery from the full charge state until the voltage larger than the discharge cutoff voltage and the second estimate value.

According to this, it is possible to grasp the error contained in the second estimate value, based on the difference amount between the second estimate value of the capacity that can be extracted from the battery in the case of discharging the battery until the voltage larger than the discharge cutoff voltage and the capacity value extracted by actually discharging the battery until the voltage. That is, it is possible to grasp the error related to the calculation of the first estimate value of the capacity that can be extracted from the battery in the case of discharging the battery from the full charge state until the discharge cutoff voltage, at a stage before discharging the battery until the discharge cutoff voltage. Since the semiconductor device corrects the first estimate value based on the error, it is possible to improve the calculation accuracy of the full charge capacity and utilize the capacity performance of the battery more efficiently.

[2] (Calculation of the Actually Extracted Capacity Value Based on an Integrated Value of a Discharge Current)

In the semiconductor device according to item 1, the data processing control unit calculates the capacity value extracted from the battery, based on an integrated value of a discharge current in the case of discharging the battery until the voltage larger than the discharge cutoff voltage.

According to this, it is possible to easily obtain the capacity value extracted from the battery by discharging the battery from the full charge state until the voltage larger than the discharge cutoff voltage.

Figure 9:
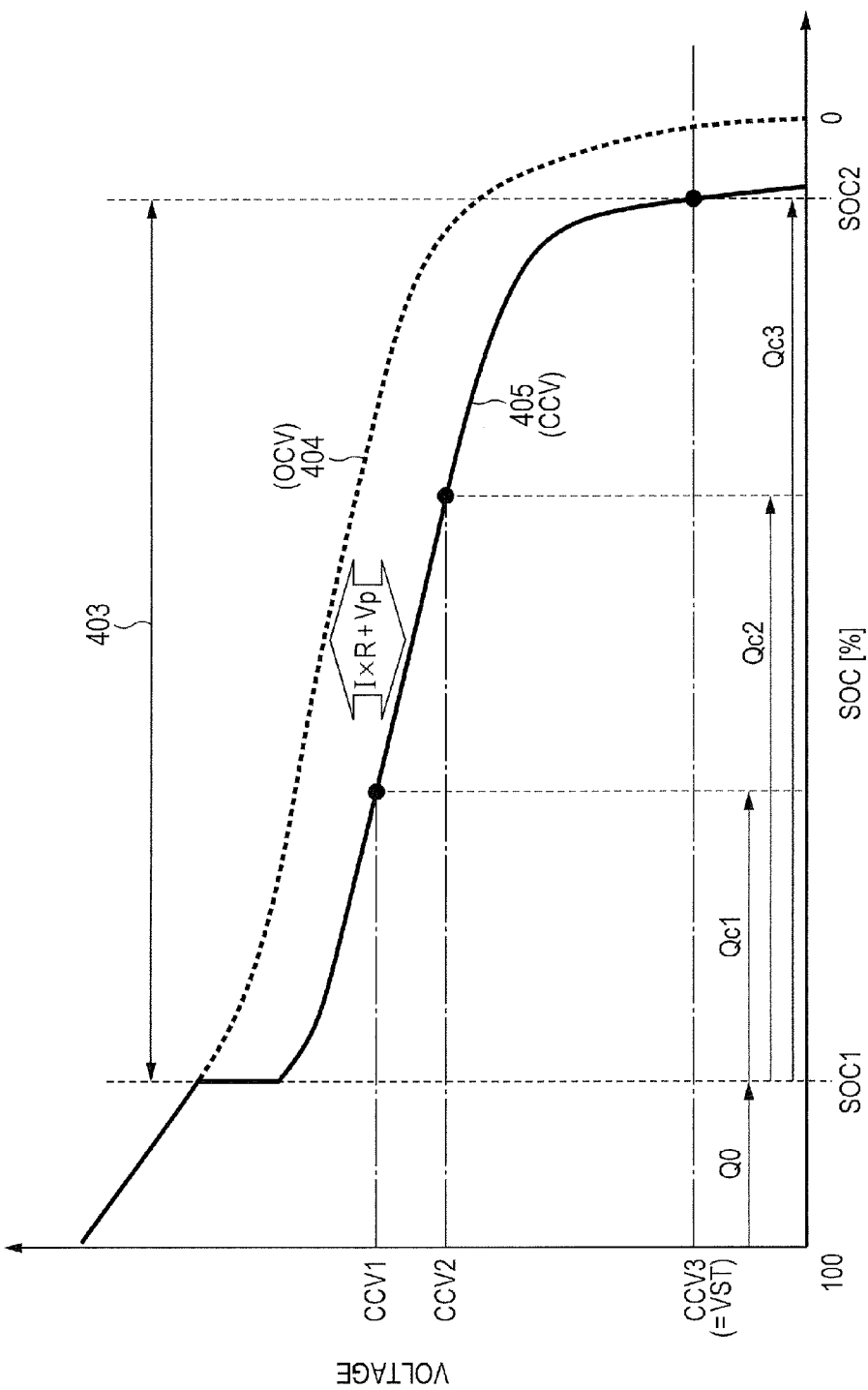
FIG. 9 is a diagram showing an outline of processing by an FCC true value calculation unit 322.

[3] (A Plurality of Correction Processes: FIG. 9)

In the semiconductor device according to item 2, the data processing control unit performs a plurality of processes for correcting the first estimate value based on the error in the second estimate value.

According to this, it is possible to further improve the calculation accuracy of the full charge capacity.

[4] (Adjustment of a Correction Amount in Accordance with a Battery Remaining Capacity: Equation 18)

In the semiconductor device according to item 2, the data processing control unit (225) adjusts a correction amount for correcting the first estimate value based on the error in the second estimate value, in accordance with a remaining capacity of the battery.

This enables flexible control for switching between correction and no correction or the degrees of correction in accordance with the remaining capacity of the battery.

Figure 12:
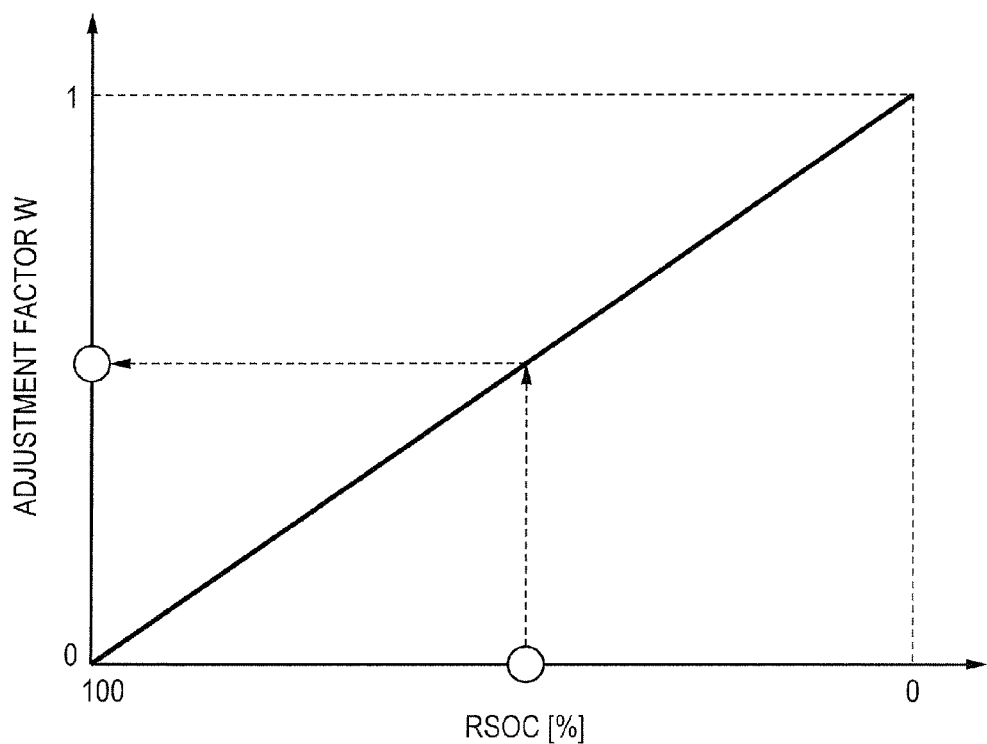
FIG. 12 is a diagram illustrating a function indicating the relationship between a remaining capacity ratio RSOC and an adjustment factor W of a correction amount.

[5] (The Correction Amount is Increased with a Decrease in the Battery Remaining Capacity: FIG. 12)

In the semiconductor device according to item 4, the data processing control unit performs adjustment so as to increase the correction amount with a decrease in the remaining capacity of the battery.

According to this, since it is possible to largely correct the first estimate value in a state of a small remaining capacity of the battery and suppress the correction amount in the other state, it is possible to improve the stability of the corrected third estimate value.

[6] (A Specific Operation Method by the Data Processing Control Unit)

In the semiconductor device according to item 2, the data processing control unit has a first operation unit (314) for calculating the first estimate value based on an estimate value (Qmax) of a total capacity of the battery in the full charge state and an estimate value (SOC2) of a charge state of the battery corresponding to the discharge cutoff voltage in the case of discharging the battery at the predetermined discharge rate. The data processing control unit further has a second operation unit (321) for calculating the second estimate value based on the estimate value of the total capacity of the battery and an estimate value (SOC2 corresponding to CCV1, etc.) of a charge state of the battery corresponding to the voltage larger than the discharge cutoff voltage in the case of discharging the battery at the predetermined discharge rate. The data processing control unit further has a third operation unit (322) for calculating the capacity value extracted from the battery by discharging the battery from the full charge state until the voltage larger than the discharge cutoff voltage, based on the integrated value of the discharge current in the case of discharging the battery until the voltage larger than the discharge cutoff voltage. The data processing control unit further has a fourth operation unit (323, 341) for calculating a difference between the second estimate value calculated by the second operation unit and the capacity value calculated by the third operation unit, correcting the first estimate value based on the difference, and generating a third estimate value (FCC3rd).

[7] (A Capacity Used from the Full Charge State Until the Predetermined Charge State: Q0+Qc)

In the semiconductor device according to item 6, the third operation unit calculates the capacity value extracted from the battery by adding the integrated value (Qc1, Qc2, Qc3) of the discharge current from when the current measurement unit starts measuring the discharge current of the battery until when the voltage of the battery reaches the voltage larger than the discharge cutoff voltage to a capacity value (Q0) lost from the battery during a period from the full charge state until the start of measurement of the discharge current.

According to this, it is possible to calculate the capacity value extracted from the battery more accurately.

[8] (Calculation of a Remaining Capacity RC)

In the semiconductor device according to item 7, the data processing control unit further has a fifth operation unit (330) for generating first remaining capacity information (RC) indicating a remaining capacity of the battery by subtracting the capacity value calculated by the third operation unit from the third estimate value calculated by the fourth operation unit.

According to this, since the remaining capacity information is generated using the corrected third estimate value, it is possible to improve the calculation accuracy of the remaining capacity of the battery.

[9] (Calculation of a Remaining Capacity Ratio RSOC)

In the semiconductor device according to item 8, the data processing control unit (225) further has a sixth operation unit (340) for calculating second remaining capacity information (RSOC) indicating a ratio of the operation result to the third estimate value. The fourth operation unit adjusts a correction amount for correcting the first estimate value based on the second remaining capacity information calculated by the sixth operation unit.

According to this, since the second remaining capacity information ranges, for example, from the actually extractable total capacity of 100% to the capacity of 0% when the battery discharges until the discharge cutoff voltage, it is possible to easily grasp the remaining capacity of the battery. Further, the use of the second remaining capacity information makes it possible to easily adjust the correction amount in accordance with the remaining capacity of the battery.

[10] (The Semiconductor Device+a Battery Pack Including a Secondary Battery)

A battery pack (100) according to an exemplary embodiment of the present application includes a secondary battery (110) comprised of single or multiple cells (111) and the semiconductor device (120) according to item 1 for monitoring a state of the secondary battery.

This makes it possible to implement the battery pack improving the accuracy of detecting the state of the secondary battery.

[11] (An Electronic Device which can be Operated by the Battery Pack)

An electronic device (10) according to an exemplary embodiment of the present application has the battery pack according to item 10 and an internal circuit (201) which can operate with power supplied from the secondary battery.

According to this, the electronic device can efficiently utilize the electricity storage energy of the secondary battery by using the state information generated by the semiconductor device.

[12] (The Electronic Device Including a Display Unit)

The electronic device according to item 11 further has a display unit (200) which can display information of the secondary battery based on the state information generated by the semiconductor device.

This makes it possible to inform a user about the information of the secondary battery.

[13] (An Electronic Device which does not Include a Secondary Battery)

An electronic device according to an exemplary embodiment of the present application includes an internal circuit (201) which can operate with power supplied from a secondary battery, the semiconductor device (120) according to item 1 for monitoring a state of the secondary battery, and a display unit (200) which can display information of the secondary battery based on the state information generated by the semiconductor device.

According to this, the electronic device can efficiently utilize the electricity storage energy of the secondary battery, as in item 11. Further, it is possible to inform the user about the state of the secondary battery used.

2. Details of Embodiments

Embodiments will be described in greater detail below.

First Embodiment

FIG. 1 illustrates a battery pack incorporating a semiconductor device according to the first embodiment. The battery pack 100 shown in FIG. 1 is coupled to an electronic device 10 such as a notebook computer and a mobile terminal to supply power (discharge), and can be charged coupled to a charger as necessary. A battery state change by the charge and discharge of the battery provided in the battery pack 100 is detected in real time by a later-described method, and the detection result is directly or indirectly transmitted to a display unit 200 provided outside the battery pack 100. The display unit 200 displays battery information based on the received detection result to inform a user of a battery state. While FIG. 1 illustrates an example in which the battery pack 100 is coupled to the electronic device 10, the battery pack 100 can also be removed from the electronic device 10.

The battery pack 100 includes an assembled battery 110 for supplying power to an internal circuit 201 of the electronic device 10, the display unit 200, etc., a semiconductor device 120 for detecting the state of the assembled battery 110, a temperature detection unit 130, a current detection unit 140, a protection unit 150, power supply terminals 160, 161, and a communication terminal 162. The internal circuit 201 can operate with power supplied from the battery pack 100, and is a function unit for implementing an objective function of the electronic device 10. While in FIG. 1 the display unit 200 is disposed outside the internal circuit 201, the display unit 200 may be included in the internal circuit 201.

The secondary battery (or assembled battery) 110 is configured by electrically series-coupling single or multiple cell groups 112 each configured by electrically parallel-coupling single or multiple cells 111 capable of being charged and discharged. For example, the capacity of the assembled battery 110 can be increased by increasing the number of parallel-coupled cells 111, and the voltage of the assembled battery 110 can be increased by increasing the number of series-coupled cells 111. The coupling configuration of the cells 111 can be determined according to the power consumption or the like of the electronic device. The capacity may be increased by increasing the number of parallel-coupled cells, and the voltage may be increased by increasing the number of series-coupled cells. Further, in the case where the power consumption of the electronic device 10 is small, only one cell 111 may be used. The power supply terminals 160, 161 are terminals for electrically coupling the assembled battery 110 to the outside (the internal circuit 201 included in the electronic device 10) to supply power. For example, the power supply terminal 160 is a terminal of a positive electrode (+), and the power supply terminal 161 is a terminal of a negative electrode (−). The protection unit 150 enables electrical coupling and decoupling between the assembled battery 110 and an external device (e.g., the internal circuit 201 of the electronic device 10). For example, the protection unit 150 is provided between the positive electrode of the assembled battery 110 and the power supply terminal 160 (+) to switch between the coupling and decoupling between the positive electrode of the assembled battery 110 and the power supply terminal 160 (+) based on a control signal from the semiconductor device 120. Although not restricted, the protection unit 150 includes, for example, a power MOS transistor etc. While the configuration illustrated in FIG. 1 includes one protection unit 150 which can be controlled by the control signal from a data processing control unit 125, it may include a plurality of protection units 150. Further, the protection unit 150 may decouple the assembled battery 110 from the internal circuit 201 included in the electronic device 10 as necessary, regardless of the control signal from the data processing control unit 125. The temperature detection unit 130 detects, as voltage information, a temperature T of the assembled battery 110. The temperature detection unit 130 is, for example, a thermistor. The current detection unit 140 detects, as voltage information, a current (charge/discharge current) flowing to/from the assembled battery 110. For example, the current detection unit 140 includes a resistive element coupled between the negative electrode of the assembled battery 110 and the power supply terminal 161 (−), and a voltage across the resistive element is detected as information of a charge current or discharge current.

The semiconductor device 120 has the function of detecting the state of the assembled battery 110 and outputting the state detection result to the outside and the function of controlling the protection unit 150. Although not restricted, the semiconductor device 120 is comprised of a semiconductor integrated circuit formed over a single semiconductor substrate made of, e.g., monocrystalline silicon, using a known CMOS integrated circuit manufacturing technology. Further, the semiconductor device 120 may be implemented in a single chip as described above, or implemented in a multichip configuration. The semiconductor device 120 is, for example, a microcontroller.

Specifically, the semiconductor device 120 includes a selection unit 121, a voltage measurement unit 122, a current measurement unit 123, a storage unit 124, the data processing control unit 125, and a communication unit 126. The selection unit 121 selects a voltage to be measured, in response to an instruction from the data processing control unit 125. For example, the selection unit 121 inputs the voltages of the cell groups 112 and the output voltage of the temperature detection unit 130, and selects and outputs any one of the voltages. The voltage measurement unit 122 measures the voltage selected by the selection unit 121. For example, the voltage measurement unit 122 A/D-converts the voltage outputted from the selection unit 121 and outputs the conversion result. Hereinafter, the AD conversion result of the voltage of each cell group 112 is expressed as voltage information DV, and the AD conversion result of the output voltage of the temperature detection unit 130 is expressed as temperature information DT. The current measurement unit 123 measures the charge/discharge current of the assembled battery 110 based on the voltage detected by the current detection unit 140. For example, the current measurement unit 123 measures the discharge current during power supply from the assembled battery 110 to the internal circuit 201, and measures the charge current during the charge of the assembled battery 110. For example, when power supply from the assembled battery 110 to the internal circuit 201 or the charge of the assembled battery 110 is started, the current measurement unit 123 A/D-converts the output voltage of the current detection unit 140 at a predetermined conversion cycle to generate information of the detection value of the charge/discharge current. Further, the current measurement unit 123 integrates the detection value of the charge/discharge current, thereby generating information of the integrated value of the charge/discharge current. Hereinafter, the information of the current generated by the current measurement unit 123 is expressed as current information DI.

The storage unit 124 is a nonvolatile storage device for storing data. For example, the storage unit 124 is comprised of, for example, a flash memory. For example, information (e.g., function or table information) indicating the correspondence relationship between OCV (Open Circuit Voltage) and SOC described later, the characteristics of the internal resistance of the cell 111, the characteristic information of the cell 111 such as a maximum discharge capacity extracted in the case of discharging the battery from a full charge state at a low rate and polarization characteristics, the parallel/series number of cells 111 configuring the cell group 112 and the assembled battery 110, the individual difference information of the cell 111, and the like are stored beforehand in the storage unit 124. Further, program information for allowing the data processing control unit 125 to execute various operations and the other characteristic information of the semiconductor device 120, the display unit 200, the battery pack 100, and the like are stored beforehand in the storage unit 124. Furthermore, the results of operations by the data processing control unit 125 described later can be stored in the storage unit 124. The above pieces of information may be stored separately in a plurality of storage units 124 or may be stored collectively in one storage unit 124, and thus the configuration and the storage method are not limited in particular.

The data processing control unit 125 is a program processing device for executing various operations in accordance with the program stored in the storage unit 124. For example, the data processing control unit 125 includes a CPU, a RAM, and the like. Although the details will be described later, based on the program stored in the storage unit 124 and the measurement results of the voltage measurement unit 122 and the current measurement unit 123, the data processing control unit 125 executes predetermined operation processing for detecting the state of the battery and generates information indicating the state of the assembled battery 110 (hereinafter referred to as "battery state information"). Further, the data processing control unit 125 generates and provides a selection signal specifying a voltage to be measured by the voltage measurement unit 122 to the selection unit 121 as necessary. Furthermore, the data processing control unit 125 transmits the operation result through the communication unit 126 to the outside, and executes processing for electrically decoupling the assembled battery 110 from the internal circuit 201 included in the electronic device 10 by sending an instruction to the protection unit 150 as necessary.

The communication unit 126 transmits information (data) generated by the data processing control unit 125 through the communication terminal 162 to the outside. Further, the communication unit 126 receives information (data) from the outside through the communication terminal 162 and transmits the received information to the data processing control unit 125. For example, the communication unit 126 transmits the battery state information to the display unit 200, and the display unit 200 displays battery information based on the received battery state information. The battery state information may be directly transmitted to the display unit 200 through the communication unit 126, or may be transmitted through the communication unit 126 to the internal circuit 201 which transmits the battery state information to the display unit 200 along with other data necessary for display. Further, the configuration and communication method of the communication unit 126 are not limited in particular as long as they enable data transmission/reception. For example, wireless communication or wire communication can be used. While FIG. 1 illustrates only one communication terminal 162 for convenience in illustration, a plurality of communication terminals may be used.

The operation processing for detecting the state of the battery by the data processing control unit 125 will be described in detail. As described above, based on the program stored in the storage unit 124 and the measurement results from the voltage measurement unit 122 and the current measurement unit 123, the data processing control unit 125 executes the predetermined operation processing and thereby generates the battery state information. The battery state information includes, for example, the full charge capacity FCC, the remaining capacity RC, the charge state SOC, and other information.

Figure 2:
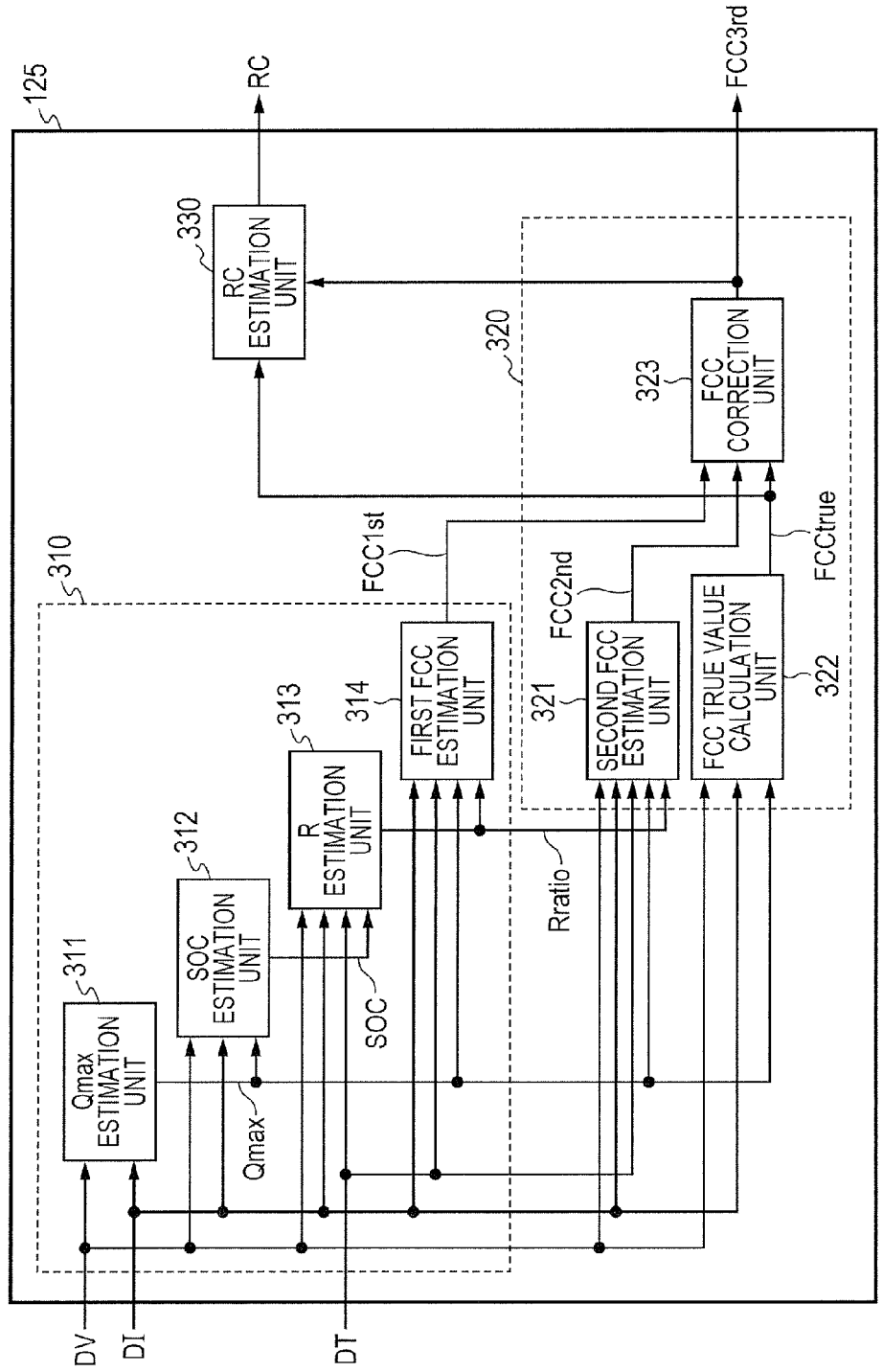
FIG. 2 is a diagram illustrating the internal configuration of a data processing control unit 125.

FIG. 2 illustrates the internal configuration of the data processing control unit 125. While the data processing control unit 125 generates the selection signal for specifying voltage to be measured and the control signal for the protection unit 150 as described above in addition to the operation processing for detecting the state of the battery, FIG. 2 illustrates only function units for implementing the operation processing for battery state detection but does not illustrate function units for implementing the other functions.

As shown in FIG. 2, the data processing control unit 125 includes an FCC basic operation unit 310, an FCC error improvement unit 320, and an RC estimation unit 330, as the function units for implementing the operation processing for battery state detection. These function units are function implementation means implemented by, for example, program processing by the CPU or the like. In the data processing control unit 125, for example, the FCC basic operation unit 310 executes basic operation processing for calculating an estimate value of the full charge capacity FCC, and the FCC error improvement unit 320 estimates an error contained in the estimate value of the full charge capacity FCC. Then, the FCC error improvement unit 320 corrects the calculated estimate value of the full charge capacity FCC, based on the estimated error. Further, in the data processing control unit 125, the RC estimation unit 330 estimates the remaining capacity RC, using the corrected estimate value of the full charge capacity FCC. Hereinafter, the function units will be described in detail.

First, the FCC basic operation unit 310 will be described. The FCC basic operation unit 310 executes various operations for estimating the full charge capacity FCC based on the voltage information DV, the current information DI, and the temperature information DT. For example, the FCC basic operation unit 310 includes a Qmax estimation unit 311, an SOC estimation unit 312, an R estimation unit 313, and a first FCC estimation unit 314, as function units corresponding to various operations.

The Qmax estimation unit 311 performs an operation for estimating the total capacity Qmax of the secondary battery in a full charge state. The capacity Qmax is a capacity value that can be extracted from the secondary battery in the case of discharging the secondary battery from the full charge state until a discharge cutoff voltage at a low rate (such a discharge rate as to allow a later-described voltage drop across an internal resistance R of the battery to be negligible). The discharge cutoff voltage is a threshold voltage for determining whether or not electricity storage energy of the secondary battery can be extracted, and the extraction of electricity storage energy of the battery is prohibited in a range where the output voltage (CCV (Closed Circuit Voltage) described later) of the secondary battery is lower than the discharge cutoff voltage. Hereinafter, the discharge cutoff voltage is referred to as a lower limit voltage VST.

The Qmax estimation unit 311 can calculate, for example, a total capacity for each cell group 112 and the total capacity of the entire assembled battery 110, as the capacity Qmax. In an ideal method for estimating the capacity Qmax, for example, the assembled battery 110 is fully discharged from the full charge state until the lower limit voltage VST at the low rate, and the capacity Qmax is obtained by integrating the discharge current from the full charge state until the lower limit voltage VST. However, in this method, there is a low possibility that the assembled battery 110 supplies power to the electronic device 10 in such an ideal discharge pattern; therefore, the Qmax estimation unit 311 estimates the capacity Qmax by the following method.

Figure 3:
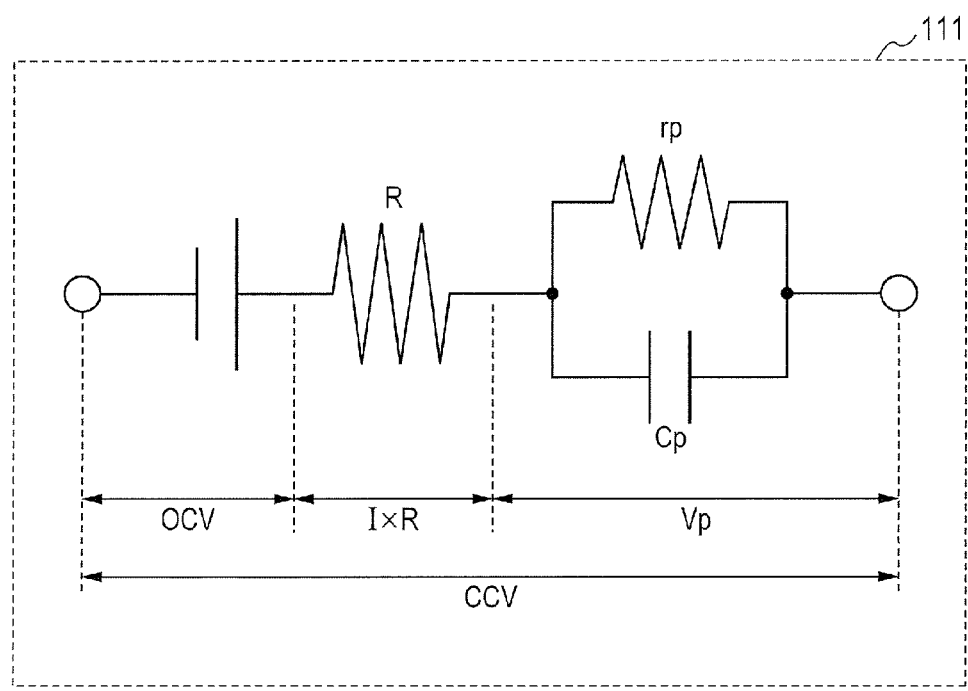
FIG. 3 is a diagram illustrating the equivalent circuit of a cell 111.
Figure 4:
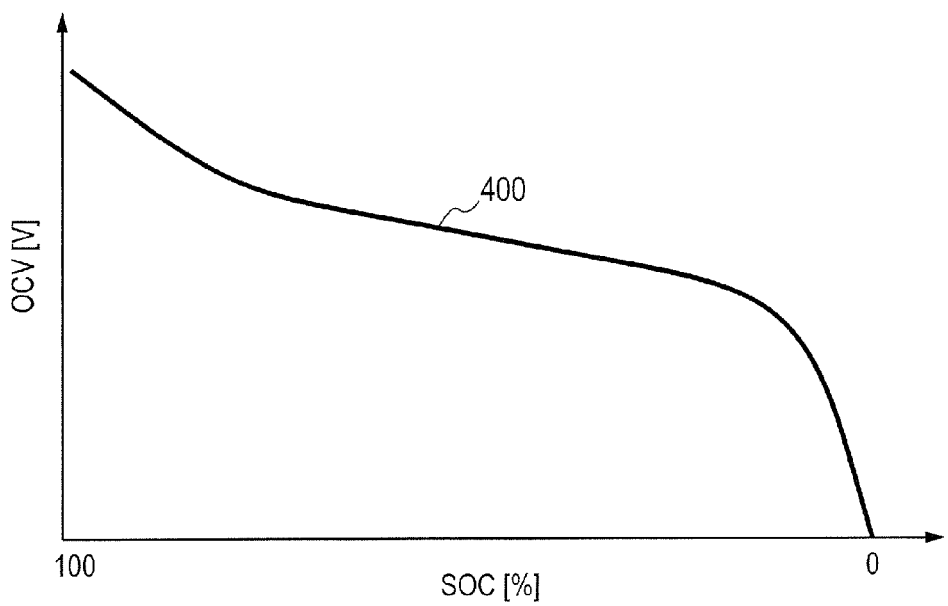
FIG. 4 is a diagram showing the relationship between a charge state SOC and a voltage OCV of the cell 111.
Figure 5:
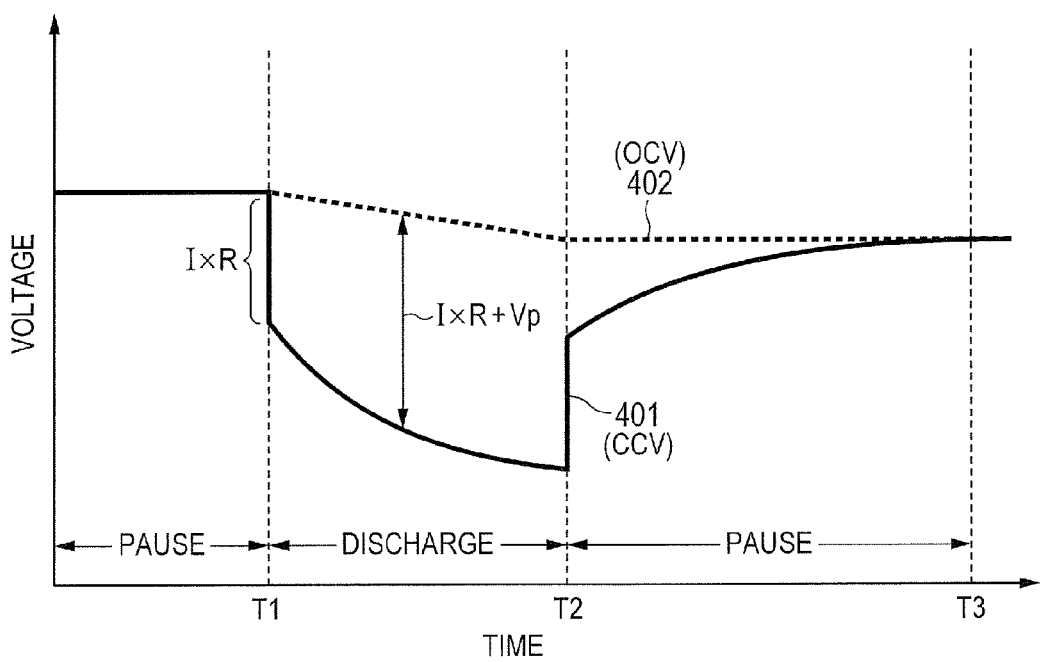
FIG. 5 is a diagram illustrating a characteristic of the voltage OCV during the discharge of the cell 111 and a characteristic of a between-terminal voltage CCV.

Before describing the method for estimating the capacity Qmax, basic characteristics of the cell 111 will first be described with reference to FIGS. 3 to 5. FIG. 3 is a diagram illustrating the equivalent circuit of the cell 111. FIG. 4 is a diagram showing the relationship between the charge state SOC and the voltage OCV. FIG. 5 is a diagram illustrating a characteristic of the voltage OCV during the discharge of the cell 111 and a characteristic of a between-terminal voltage CCV. In FIG. 5, reference numeral 401 denotes the characteristic of the between-terminal voltage CCV, and reference numeral 402 denotes the characteristic of the voltage OCV during the discharge of the cell 111.

As shown in FIG. 3, the cell 111 can be configured by series-coupling the voltage OCV of the cell 111, an internal resistance R, and a parallel-coupling pair of a polarization resistance rp and a capacitance component Cp, in a state of no charge/discharge (in a state of no flow of charge/discharge current). For example, letting I be a current flowing through the cell 111, the between-terminal voltage CCV is expressed by the following equation (1), where Vp is a polarization voltage and corresponds to the voltage of the parallel-coupling pair of the polarization resistance rp and the capacitance component Cp.

$$CCV = OCV + I \times R + Vp \tag{1}$$

Further, as shown in FIG. 4, for example reference numeral 400 represents the characteristic of the voltage OCV with respect to the charge state SOC (0% to 100%) of the cell. Accordingly, with the function indicated by reference numeral 400, it is possible to easily estimate the value of the charge state SOC corresponding to the measurement value of the voltage OCV.

However, as shown in FIG. 5, the characteristic 401 of the between-terminal voltage CCV during the discharge of the cell 111 differs from the characteristic 402 of the voltage OCV; therefore, it is difficult to directly measure the voltage OCV during the discharge of the cell 111. More specifically, in the between-terminal voltage CCV, a voltage drop of I×R occurs immediately after the discharge of the cell 111. Further, the voltage CCV is affected by the polarization voltage Vp in addition to the voltage drop of I×R during the discharge (period from time T1 to T2), and continues to change due to the polarization voltage Vp during a predetermined period (period from time T2 to T3) after the stop of the discharge. Therefore, it is not possible to measure the voltage OCV during the discharge of the cell, and it is necessary to measure the voltage OCV at timing before time T1 or after time T3.

Figure 6:
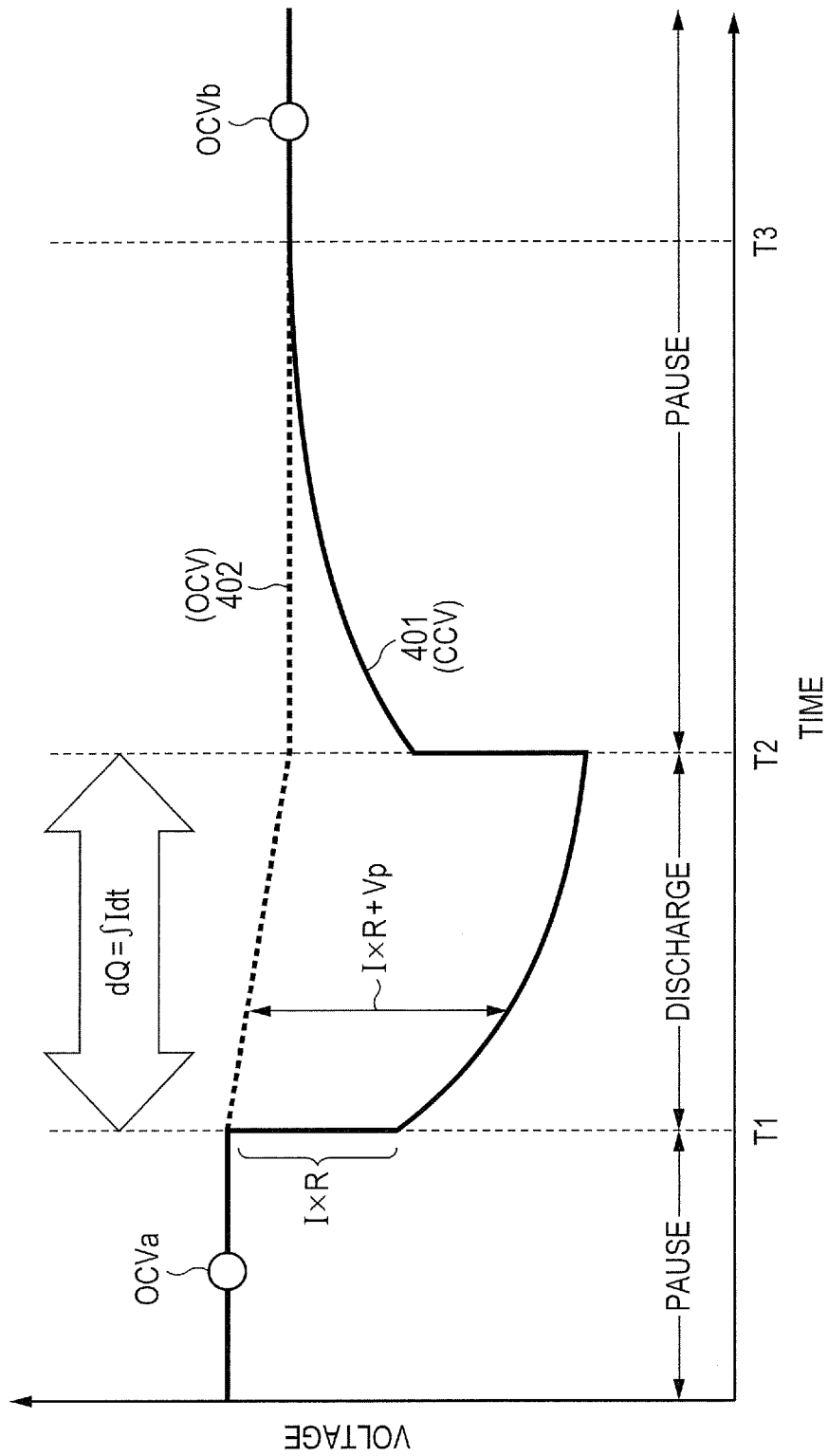
FIG. 6 is a diagram showing an outline of a method for calculating a capacity Qmax.

In consideration of the above characteristics of the cell 111, the Qmax estimation unit 311 estimates the capacity Qmax. FIG. 6 is a diagram showing an outline of a method for calculating the capacity Qmax by the Qmax estimation unit 311. In FIG. 6, the characteristic 402 of the voltage OCV during the discharge of the cell 111 and the characteristic 401 of the between-terminal voltage CCV are shown as in FIG. 5.

For example, assume that the discharge of the cell starts from the charge state SOCa and the charge state of the cell becomes SOCb after a lapse of a predetermined time. In this case, the capacity Qmax is expressed by the following equation (2).

$$Q\text{max} = 100 \times \frac{dQ}{(SOCa - SOCb)} \quad (2)$$

In the equation (2), dQ ($=\int I(t)dt$) is an integrated value of the discharge current during the discharge period. Further, the charge states SOCa, SOCb can be calculated from the measurement value of the voltage OCV by using the relationship between the voltage OCV and SOC shown by the characteristic 400 in FIG. 4 as described above. To obtain the information of the voltage OCV, it is necessary to measure the between-terminal voltage of the cell at timing before time T1 or after time T3 as described above. Accordingly, to obtain the voltage OCV before and after the charge/discharge, the Qmax estimation unit 311 measures a voltage OCVa at timing before time T1 and measures a voltage OCVb at timing after time T3 as shown in FIG. 6. Then, the Qmax estimation unit 311 calculates the charge states SOCa, SOCb corresponding to the measurement values OCVa, OCVb of the voltage OCV, using the relationship (function) between the voltage OCV and SOC. For example, information (e.g., a function or table) indicating the correspondence relationship between the voltage OCV and the charge state SOC is stored beforehand in the storage unit 124, and the Qmax estimation unit 311 refers to the function or table stored in the storage unit 124 and reads out the values of the charge states SOCa, SOCb corresponding to the measured voltages OCVa, OCVb. Then, based on the read values of the charge states SOCa, SOCb and the integrated value dQ of the current information DI acquired from the current measurement unit 123 from time T1 to T2, the Qmax estimation unit 311 performs the operation of the equation (2) and thereby calculates the capacity Qmax. In this embodiment, t facilitate understanding, the Qmax estimation unit 311 acquires voltage information for each cell group 112 as the voltage information DV, and calculates the average Qmax, using the average voltage of the assembled battery 110 obtained by averaging the voltage information. Further, timing when the Qmax estimation unit 311 calculates the capacity Qmax is not limited in particular as long as it is timing after time T3. For example, during a period from the stop of power supply from the assembled battery 110 to the internal circuit 201 to the restart of power supply, the voltage OCVb may be measured and the capacity Qmax may be calculated. Alternatively, the voltage OCVb may be measured during the above period, and then the capacity Qmax may be calculated after the restart of power supply.

The SOC estimation unit 312 performs an operation for estimating the charge state SOC of the cell, based on the voltage information DV acquired from the voltage measurement unit 122, the current information DI acquired from the current measurement unit 123, and the capacity Qmax acquired from the Qmax estimation unit 311. As described above, the capacity Qmax calculated by the Qmax estimation unit 311 is the average Qmax of the entire assembled battery 110; accordingly, the SOC estimation unit 312 also uses the average voltage value of the assembled battery 110 for the operation. That is, in this embodiment, the SOC estimation unit 312 calculates the average SOC of the assembled battery 110.

As described above, the table or function based on the correspondence relationship between the voltage OCV of the cell 111 and the charge state SOC is stored beforehand in the storage unit 124 and used, thereby making it possible to easily calculate the value of the corresponding charge state SOC from the measurement value of the voltage OCV. However, as shown in FIGS. 5 and 6, it is not possible to directly measure the voltage OCV during the period of, charge/discharge of the cell (period from time T1 to T2) and during the predetermined period (period from time T2 to T3) after the charge/discharge. For this reason, the SOC estimation unit 312 estimates the charge state SOC by the following method.

First, the SOC estimation unit 312 calculates an initial value SOC0 of SOC before charging/discharging the battery pack 100, based on the following equation (3). In the equation (3), SOC(OCV) is a function representing the characteristic 400 in FIG. 4 (function SOC of the voltage OCV). As shown in the equation (3), it is possible to easily calculate the charge state during a period before the charge/discharge of the cell (e.g., the period before time T1 in FIG. 6) based on the measurement value of the voltage OCV.

$$SOC0 = SOC(OCV) \quad (3)$$

Then, after the start of the discharge of the assembled battery 110 (after time T1), the SOC estimation unit 312 calculates a variation ΔSOC of the charge state SOC from the initial value SOC0, based on the following equation (4). In the equation (4), $\int I(t)dt$ is the integrated value of the discharge current from the start of the discharge, and is the measurement value of the current measurement unit 123.

$$\Delta SOC = 100 \times \frac{\int Idt}{Q\text{max}} \quad (4)$$

Then, the SOC estimation unit 312 estimates the charge state SOC, using the following equation (5). The obtained charge state SOC is inputted to the R estimation unit 313.

$$SOC = SOC0 + \Delta SOC \quad (5)$$

The R estimation unit 313 performs an operation for estimating the internal resistance of the assembled battery 110 and a rise ratio Rratio of the internal resistance. The obtained rise ratio Rratio of the internal resistance R1 is used by the first FCC estimation unit 314 and a second FCC estimation unit 321 described later.

Figure 7:
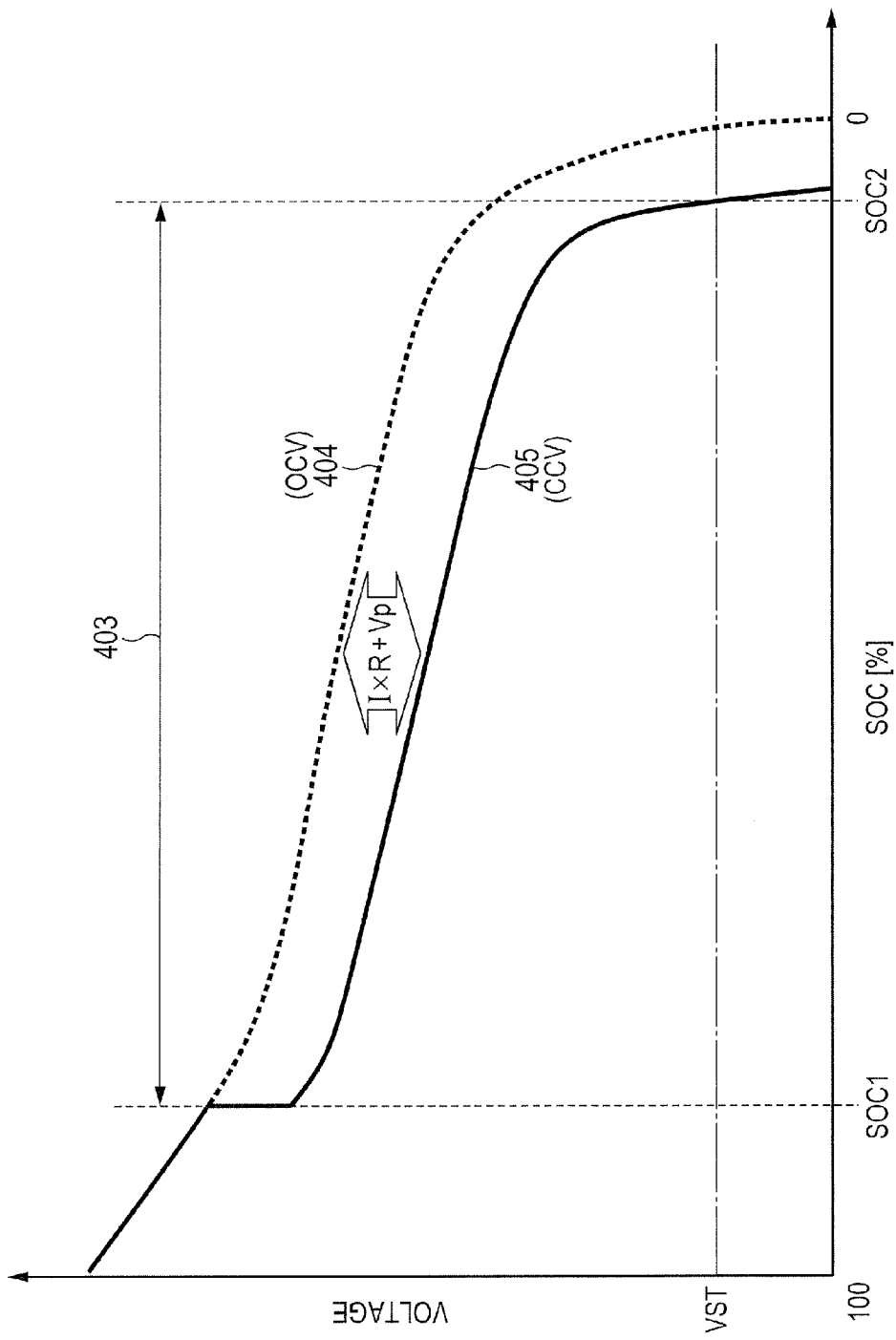
FIG. 7 is a diagram illustrating characteristics of a battery voltage with respect to the charge state SOC during discharge.

FIG. 7 is a diagram illustrating characteristics of the battery voltage with respect to the charge state SOC during discharge. FIG. 7 illustrates a characteristic 404 of the voltage OCV and a characteristic 405 of the voltage CCV in the case where power supply (discharge) from the assembled battery 110 to the internal circuit 201 starts at a charge state SOC1 and the discharge stops at a charge state SOC2 where the voltage CCV reaches the lower limit voltage VST. In FIG. 7, reference numeral 403 denotes the period of power supply from the assembled battery 110 to the internal circuit 201 (period of discharge of the battery).

As indicated by reference numeral 405, when the discharge of the assembled battery 110 starts at the charge state SOC1, the voltage CCV drops by the product (I×R) of the internal resistance R of the assembled battery 110 and the current I plus the polarization voltage Vp. Accordingly, the internal resistance R1 of the battery including the internal resistance R and the polarization resistance rp can be expressed by the following equation (6). In the equation (6), CCV is the measurement value of the average voltage of the assembled battery 110 by the voltage measurement unit 122, OCV(SOC) is the voltage OCV corresponding to the charge state SOC calculated by the SOC estimation unit 312 (conversion result by the above function SOC of OCV), and I is the measurement result of the current flowing to/from the assembled battery 110 by the current measurement unit 123. The R estimation unit 313 calculates the internal resistance R1 based on the following equation (6).

$$R1 = \frac{CCV - OCV(SOC)}{I} \quad (6)$$

Further, the R estimation unit 313 obtains an initial value R0 of the internal resistance R1 of the assembled battery 110, based on the following equation (7). More specifically, a table or function (hereinafter referred to as an "internal resistance characteristic table") Rbase(T, SOC) having the value of the internal resistance R1 mapped in accordance with the temperature T and the charge state SOC is stored beforehand in the storage unit 124. Then, the R estimation unit 313 refers to the internal resistance characteristic table Rbase(T, SOC) from the storage unit 124, and reads out the value of the internal resistance R1 corresponding to the information of the temperature T contained in the temperature information DT and the charge state SOC calculated by the SOC estimation unit 312, as the initial value R0 of the internal resistance R1.

$$R0 = R\text{base}(T,SOC) \quad (7)$$

Further, the R estimation unit 313 calculates the rise ratio Rratio of the internal resistance R1 with respect to the initial value R0, based on the following equation (8). In the equation (8), R1 is the value calculated by the equation (6), and R0 is the value calculated in the equation (7).

$$Rratio = 100 \times \frac{R1}{R0} \quad (8)$$

The first FCC estimation unit 314 estimates the full charge capacity FCC. As described above, the full charge capacity FCC is information indicating a capacity value that can be extracted from the secondary battery in the case of discharging the secondary battery from the full charge state until the discharge cutoff voltage at a predetermined discharge rate. The predetermined discharge rate is assumed to be larger than "the low rate (such a discharge rate as to allow the voltage drop across the internal resistance R1 to be negligible)" based on which the capacity Qmax is calculated. The larger discharge rate increases the voltage drop, so that the voltage CCV of the assembled battery 110 easily reaches the lower limit voltage VST. Therefore, the full charge capacity FCC is smaller than the total capacity Qmax.

More specifically, the first FCC estimation unit 314 calculates an estimate value FCC1st of the capacity (full charge capacity) that can be extracted from the assembled battery 110 in the case of discharging the assembled battery 110 from the full charge state until the discharge cutoff voltage VST at the predetermined discharge rate.

A method for estimating the full charge capacity by the first FCC estimation unit 314 will be described with reference to FIG. 7. Since the full charge capacity is the capacity value that can be extracted in discharging at the predetermined rate until the voltage of the assembled battery 110 reaches the lower limit voltage VST, the lower limit of the usable charge state SOC is not 0% but is the charge state SOC2 larger than 0%, as shown in FIG. 7. That is, the usable charge state of the battery pack 100 cannot range from 100% to 0%, but actually ranges from 100% only to the charge state SOC2. Therefore, the full charge capacity FCC1st can be expressed by the following equation (9). In the equation (9), SOC2 is a value indicating the charge state of the assembled battery 110 when the voltage CCV of the assembled battery 110 reaches the lower limit voltage VST.

$$FCC1st = Q\max \times \frac{(100 - SOC2)}{100} \quad (9)$$

As can be seen from the equation (9), the estimate value FCC1st of the full charge capacity can be estimated based on the value of the capacity Qmax and the value of the charge state SOC2. Since the capacity Qmax has been obtained by the Qmax estimation unit 311, only the value of the charge state SOC2 needs to be obtained. Accordingly, the first FCC estimation unit 314 estimates the charge state SOC2 by the following method, and calculates the equation (9) based on the estimated value and the capacity Qmax obtained by the Qmax estimation unit 311, thereby to calculate the estimate value FCC1st of the full charge capacity. Hereinafter, a method for estimating the charge state SOC2 will be described.

Processing for estimating the charge state SOC2 is processing for finding the value of the charge state SOC when the voltage CCV of the assembled battery 110 matches the lower limit voltage VST in discharging at the predetermined rate. In this embodiment, a method for finding the charge state SOC2 by using a characteristic of the internal resistance R1 including the polarization resistance rp will be described.

The voltage CCV of the assembled battery 110 can be expressed by the following equation (10), in consideration of the characteristic of the internal resistance R1. In the equation (10), Rratio is an operation result by the R estimation unit 313, SOCc is a variable for finding the charge state SOC2, T is temperature information based on the temperature information DT, OCV(SOCc) is a function of SOCc, and Rbase (SOCc, T) is a table or function representing the characteristic of the internal resistance R1 including the polarization resistance rp in accordance with the temperature T and the charge state SOC.

$$CCV = OCV(SOC0) + I \times R\text{base}(SOCc, T) \times R\text{ratio} \qquad (10)$$

The first FCC estimation unit 314 calculates the voltage CCV by sequentially changing the variable "SOCc" in the equation (10), and determines "SOCc" when the calculated value matches the lower limit voltage VST to be the charge state SOC2 corresponding to the lower limit voltage VST.

Figure 8:
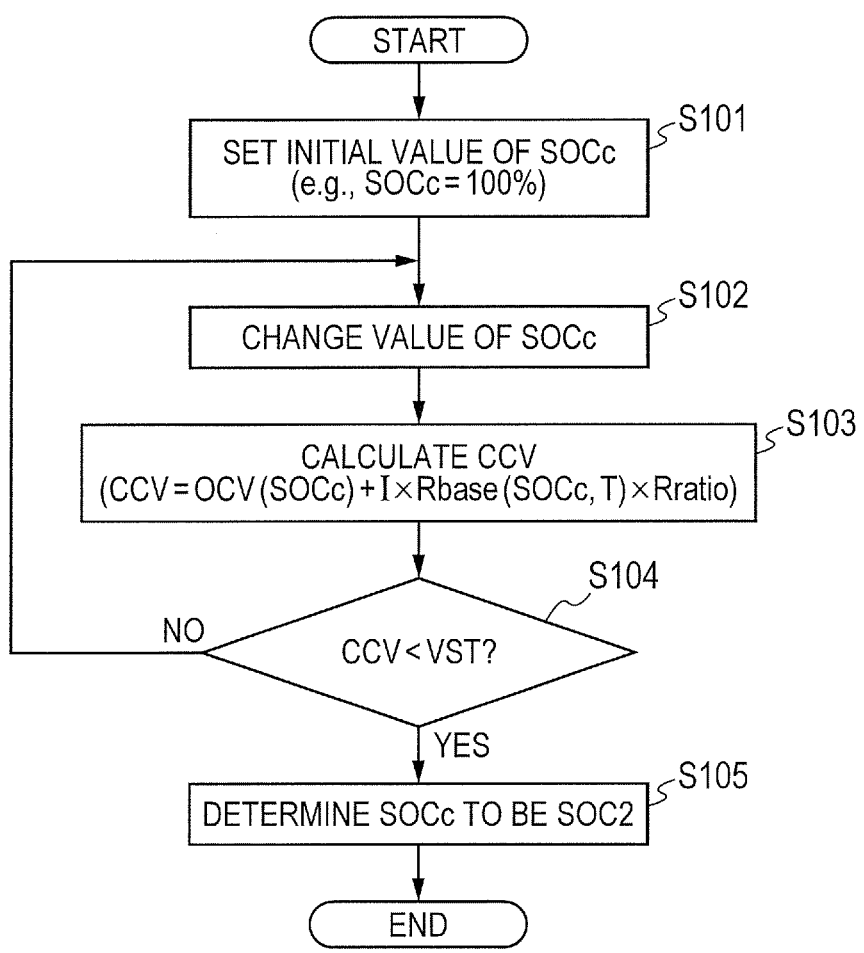
FIG. 8 is a diagram illustrating a processing flow according to processing for estimating a charge state SOC2 by a first FCC estimation unit 314.

FIG. 8 illustrates a processing flow according to processing for estimating the charge state SOC2 by the first FCC estimation unit 314. First, the first FCC estimation unit 314 sets an initial value (e.g., 100%) of the variable SOCc in the equation (10) (S101). Next, the first FCC estimation unit 314 changes the variable SOCc to a value smaller than the set value by a predetermined amount (S102). For example, in the case where the set initial value is 100% and the predetermined amount is 1%, the first FCC estimation unit 314 changes the set value of the variable SOCc from 100% to "99%". Then, the first FCC estimation unit 314 calculates the equation (10), using the variable SOCc set in step S102, and thereby calculates the voltage CCV (S103). Then, the first FCC estimation unit 314 determines whether or not the voltage CCV calculated in step S103 is smaller than the lower limit voltage VST (S104). If the calculated voltage CCV is larger than the lower limit voltage VST, the first FCC estimation unit 314 repeats processing for changing the variable SOCc and calculating the voltage CCV until the voltage CCV becomes smaller than the lower limit voltage VST (S102 to S104). Then, when the voltage CCV becomes smaller than the lower limit voltage VST, the first FCC estimation unit 314 determines the variable SOCc set at the time to be the charge state SOC2 (S105). As shown in the equation (10), due to the use of the temperature information T detected by the temperature detection unit 130, the charge state SOC2 is estimated, in consideration of the temperature, by the above method.

After estimating the charge state SOC2 by the above method, the first FCC estimation unit 314 calculates the equation (9) based on the value of the estimated charge state SOC2 and the value of the capacity Qmax obtained by the Qmax estimation unit 311, thereby to obtain the estimate value FCC1st of the full charge capacity.

The estimate value FCC1st of the full charge capacity thus calculated by the FCC basic operation unit 310 might include a large error as described above. For example, the equations (7) and (10) use the measurement value of the temperature T of the battery. Accordingly, a measurement error in the temperature T causes an error in the calculation result of the equations (7) and (10), which causes an error in the calculation result of the equations (9) using the calculation result of the equations (7) and (10), that is, the estimate value FCC1st of the full charge capacity. In the case of a large measurement error in the temperature T, there might be calculated the estimate value FCC1st of the full charge capacity exceeding the actual performance of the assembled battery 110. Thus, in the case where the estimate value of the full charge capacity might have a large error, for example a large capacity margin needs to be considered for the use of the assembled battery 110, which consequently cannot maximize the use of the electricity storage energy of the assembled battery 110. For this reason, in the semiconductor device 120, the FCC error improvement unit 320 corrects the estimate value FCC1st of the full charge capacity calculated by the FCC basic operation unit 310. Hereinafter, the FCC error improvement unit 320 will be described in detail.

The FCC error improvement unit 320 includes, for example, a second FCC estimation unit 321, an FCC true value calculation unit 322, and an FCC correction unit 323.

The second FCC estimation unit 321 calculates an estimate value FCC2nd of a capacity that can be extracted from the assembled battery 110 in the case of discharging the assembled battery 110 from the full charge state until a voltage (hereinafter referred to as a "tentative lower limit voltage") larger than the lower limit voltage VST at the predetermined discharge rate. The second FCC estimation unit 321 performs substantially the same processing as the first FCC estimation unit 314, but uses a different lower limit voltage in the operation. More specifically, the first FCC estimation unit 314 estimates the full charge capacity in the case of discharging the battery until the true lower limit voltage VST of the assembled battery 110 by calculating the equation (9), whereas the second FCC estimation unit 321 calculates the estimate value FCC2nd of the capacity by calculating the equation (9) with a measurement value of the voltage measurement unit 122 at a given time as the tentative lower limit voltage. For example, in the case where the true lower limit voltage VST of each cell 111 is "3.0 V", the first FCC estimation unit 314 estimates the charge state SOC2 when the voltage CCV of the cell 111 reaches 3.0 V, and calculates the estimate value FCC1st of the full charge capacity in the case of discharging the cell until the charge state SOC2. On the other hand, in the case where the average voltage of the assembled battery 110 measured by the voltage measurement unit 122 at a given time is 3.6 V, the second FCC estimation unit 321 calculates the estimate value FCC2nd of the full charge capacity with a lower limit voltage of 3.6 V. While processing for estimating the charge state SOC2 corresponding to the tentative lower limit voltage by the second FCC estimation unit 321 has substantially the same processing flow as in FIG. 8, a threshold value used in determination in step S104 is different from that of the first FCC estimation unit 314. That is, in the processing for estimating the charge state SOC2 by the second FCC estimation unit 321, in step S104, the second FCC estimation unit 321 determines whether or not the calculated voltage CCV exceeds the tentative lower limit voltage (the average voltage of the assembled battery 110 measured by the voltage measurement unit 122, e.g., 3.6 V). Thus, the second FCC estimation unit 321 repeatedly calculates the estimate value FCC2nd of the capacity with the voltage of the assembled battery 110 measured by the voltage measurement unit 122 as the lower limit voltage.

The FCC true value calculation unit 322 calculates a capacity value extracted from the assembled battery 110 by discharging the assembled battery 110 from the full charge state until the tentative lower limit voltage, based on the integrated value of the discharge current in the case of discharging the assembled battery 110 until the tentative lower limit voltage. Hereinafter, this capacity value is expressed as a FCC true value (FCCtrue). The FCC true value is a reference value for estimating an error contained in the estimate value FCC2nd of the capacity calculated by the second FCC estimation unit 321. Hereinafter, a method for calculating the FCC true value by the FCC true value calculation unit 322 will be described.

FIG. 9 is a diagram showing an outline of processing by the FCC true value calculation unit 322. As described above, the second FCC estimation unit 321 calculates the estimate value FCC2nd of the capacity with the measurement value of the voltage measurement unit 122 as the tentative lower limit voltage. The true value of the estimate value FCC2nd of the capacity is the sum of an integrated value Qc of the discharge current from when the current measurement unit 123 starts measuring the discharge current of the battery (the assembled battery 110 starts supplying power to the internal circuit 201) until when the voltage of the battery reaches the tentative lower limit voltage and a capacity value Q0 lost from the battery during the period from the full charge state until the start of the measurement of the discharge current. For example, if the discharge is started from the charge state SOC of 100%, the true value of the estimate value FCC2nd of the capacity is the integrated value of the discharge current from the start of the discharge until the tentative lower limit voltage. On the other hand, if the discharge is started from the charge state SOC of less than 100% (e.g., charge state SOC1=80%), the true value of the estimate value FCC2nd of the capacity is the sum of the integrated value Qc (e.g., Qc1, Qc2, Qc3 in FIG. 9) of the discharge current from the start of the discharge until the tentative lower limit voltage and the capacity value Q0 (in the above example, 100%−80%=20%) lost from the battery during the period until the start of the discharge.

The capacity value Q0, the integrated value Qc of the discharge current, and the FCC true value (FCCtrue) are expressed by the following equations (11), (12), and (13), respectively. In the equation (11), SOC1 is the charge state when the assembled battery 110 starts supplying power to the internal circuit 201. The FCC true value calculation unit 322 calculates the equations (11) to (13) and thereby calculates the true value (FCCtrue) of the estimate value FCC2nd of the capacity.

$$Q0 = Q\max \times \frac{(100 - SOC1)}{100} \quad (11)$$

$$Qc = \int I dt \quad (12)$$

$$FCCtrue = Q0 + Qc \quad (13)$$

The FCC correction unit 323 calculates an error contained in the estimate value FCC2nd of the capacity. More specifically, the FCC correction unit 323 calculates a difference amount between the estimate value FCC2nd of the capacity calculated by the second FCC estimation unit 321 with the measurement value of the voltage measurement unit 122 as the lower limit voltage and the FCC true value FCCtrue calculated by the FCC true value calculation unit 322 based on the equations (11) to (13). Hereinafter, this difference amount is expressed as an FCC error FCCerr.

For example, as shown in the following equation (14), the FCC correction unit 323 subtracts the true value FCCtrue from the estimate value FCC2nd of the capacity, and thereby calculates the FCC error FCCerr.

$$FCCerr = FCC2nd - FCCtrue \quad (14)$$

Further, with the FCC error FCCerr obtained by the equation (14) as a correction amount, the FCC correction unit 323 corrects the estimate value FCC1st of the full charge capacity calculated by the first FCC estimation unit 314, and outputs the correction result as the final information of the full charge capacity FCC. Hereinafter, the corrected estimate value of the full charge capacity is expressed as FCC3rd. For example, as shown in the following equation (15), the estimate value FCC1st of the full charge capacity is corrected by subtracting the FCC error FCCerr from the estimate value FCC1st of the full charge capacity.

$$FCC3rd = FCC1st - FCCerr \quad (15)$$

Correction processing by the FCC correction unit 323 will be described in greater detail with reference to FIGS. 10A to 10C.

Figure 10:
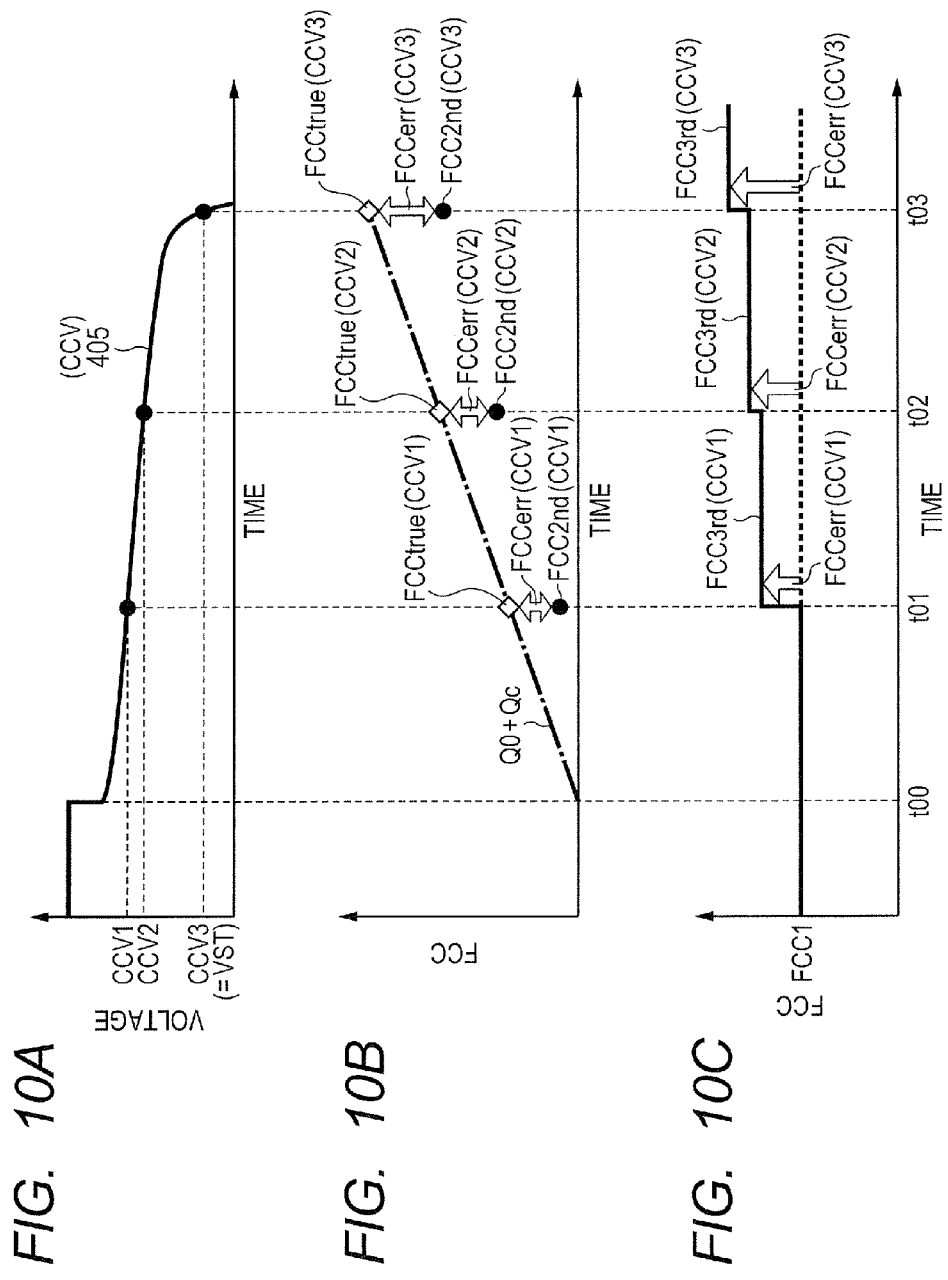
FIGS. 10A to 10C are diagrams showing an outline of processing for correcting an estimate value FCC1st of a full charge capacity by an FCC correction unit 323.

FIGS. 10A to 10C are diagrams showing an outline of processing for correcting the estimate value FCC1st of the full charge capacity by the FCC correction unit 323. FIG. 10A shows a characteristic of the battery voltage with respect to the time, FIG. 10B shows the output (FCC2nd) of the second FCC estimation unit 321 and the output (FCCtrue) of the FCC true value calculation unit 322, and FIG. 10C shows the correction result (FCC3rd) of the output (FCC1st) of the first FCC estimation unit 314 by the FCC correction unit 323. FIGS. 10A to 10C show the example in which the charge state at time t00 when the discharge is started is 100% and the true lower limit voltage VST is "CCV3". Further, the estimate value FCC1st of the full charge capacity is assumed to be calculated by the first FCC estimation unit 314 at timing before time t01.

First, at time t00, power supply from the assembled battery 110 to the internal circuit 201 is started, and the discharge current I flows from the assembled battery 110. Then, at time t01, the second FCC estimation unit 321 outputs an estimate value FCC2nd(CCV1) of the capacity with a voltage CCV1 measured by the voltage measurement unit 122 as a tentative lower limit voltage. Further, the FCC true value calculation unit 322 outputs the integrated value of the discharge current from time t00 to time t01 as an FCC true value FCCtrue (CCV1) with the voltage CCV1 as the tentative lower limit voltage. The FCC correction unit 323 calculates the difference between the estimate value FCC2nd(CCV1) of the capacity outputted from the second FCC estimation unit 321 and the FCC true value FCCtrue(CCV1) outputted from the FCC true value calculation unit 322, as an FCC error FCCerr (CCV1) based on the voltage CCV1. Then, with the FCC error FCCerr(CCV1) as a correction amount, the FCC correction unit 323 corrects the estimate value FCC1st of the full charge capacity by the above method, and outputs the corrected estimate value FCC3rd(CCV1) of the full charge capacity as the final information of the full charge capacity FCC. Then, at time t02 after a lapse of a predetermined time, in the same way, an estimate value FCC2nd(CCV2) of the capacity and an FCC true value FCCtrue(CCV2) are calculated with a measured voltage CCV2 as a tentative lower limit voltage, and also an FCC error FCCerr(CCV2) based on the voltage CCV2 is calculated. Then, the FCC correction unit 323 again corrects the estimate value FCC1st of the full charge capacity based on the FCC error, and outputs the corrected estimate value FCC3rd(CCV2) of the full charge capacity as the final information of the full charge capacity FCC. The above processing is repeated until the voltage CCV3 as the true lower limit voltage VST of the assembled battery 110, thereby improving the error in the full charge capacity FCC.

The corrected estimate value FCC3rd of the full charge capacity generated by the FCC error improvement unit 320 by the above method is inputted to the RC estimation unit 330. The RC estimation unit 330 calculates the remaining capacity RC by the following equation (16), using the corrected full charge capacity FCC3rd. In the equation (16), (Q0+Qc) is the same as in the equation (13); however, this is not used to calculate the true value with the current voltage of the assembled battery 110 as the lower limit voltage but is used to grasp the discharge amount of the assembled battery 110 from the full charge state until the current state.

$$RC = FCC3rd - (Q0 + Qc) \quad (16)$$

As shown in the equation (16), the capacity (Q0+Qc) discharged until the current state from the assembled battery 110 is subtracted from the capacity FCC (FCC3rd) extracted from the full charge state, thereby calculating the remaining capacity RC of the assembled battery 110. The value of the remaining capacity RC is calculated based on the estimate value FCC3rd of the full charge capacity, and therefore becomes more accurate.

The corrected estimate value FCC3rd of the full charge capacity generated by the FCC error improvement unit 320, the information of the remaining capacity RC calculated by the RC estimation unit 330, and the like are directly or indirectly transmitted through the communication unit 126 to the display unit 200, as battery state information. Thereby, for example by displaying the corrected estimate value FCC3rd of the full charge capacity as the actually usable full charge capacity FCC of the battery and displaying the remaining capacity RC as the actually usable remaining capacity of the battery, it is possible to inform the user about the state of the assembled battery 110. Further, the display method of the display unit 200 is not limited in particular. For example, numerical values may be used for display, or the position of the remaining capacity RC with respect to the corrected estimate value FCC3rd of the full charge capacity can be meter-displayed or illustrated. Thereby, the user can determine, based on the displayed information, whether or not to charge the battery pack 100 or stop the use of the electronic device 10 using the battery pack 100 as a power source. Further, when the value of the remaining capacity RC becomes lower than a predetermined threshold value, for example, the protection unit 150 decouples the assembled battery 110 in accordance with an instruction from the data processing control unit 125, thereby making it possible to stop the discharge of the assembled battery 110.

Thus, according to the semiconductor device 120 of the first embodiment, it is possible to grasp the error contained in the estimate value FCC2nd of the capacity, based on the difference amount between the estimate value FCC2nd of the capacity that can be extracted in the case of discharging the battery until the tentative lower limit voltage larger than the lower limit voltage VST and the FCC true value FCCtrue extracted by actually discharging the battery until the tentative lower limit voltage. That is, it is possible to grasp the error related to the calculation of the full charge capacity FCC at a previous stage without discharging the battery until the true lower limit voltage VST. Since the semiconductor device corrects the estimate value FCC1st of the full charge capacity based on the error, it is possible to improve the calculation accuracy of the full charge capacity FCC. For example, even if the error of the estimate value FCC1st of the full charge capacity is increased due to the measurement error of the temperature of the battery as described above, it is possible to correct the error and obtain more accurate information of the full charge capacity FCC. Further, for example, even if the capacity Qmax of the assembled battery 110 is decreased due to deterioration of the battery by leaving the battery for a long term, according to the semiconductor device 120, it is possible to suppress a decrease in the calculation accuracy of the full charge capacity FCC. For example, when the use of the battery resumes after the long-term leaving, there might be a difference between the actual capacity Qmax of the battery and the capacity Qmax grasped by the data processing control unit 125, causing a large error in the calculated estimate value FCC1st of the full charge capacity. However, according to the semiconductor device 120, since the estimate value FCC1st of the full charge capacity is corrected based on the FCC error FCCerr calculated after the discharge, it is possible to decrease the calculation error of the estimate value FCC1st of the full charge capacity associated with the decrease of the capacity Qmax after the long-term leaving. Therefore, according to the semiconductor device, it is possible to improve the calculation accuracy of the full charge capacity FCC and make the remaining capacity RC more accurate, and therefore utilize the capacity performance of the battery more efficiently.

Second Embodiment

In the first embodiment, the estimate value FCC1st of the full charge capacity is corrected, with the FCC error (FCCerr) which is the output difference between the second FCC estimation unit 321 and the FCC true value calculation unit 322, as the correction amount. The second embodiment differs from the first embodiment in that the correction amount is adjusted in accordance with the charge state.

In the secondary battery, there might be a difference in the estimated value of the FCC error FCCerr, depending on the charge state. For example, there might be a large difference in the calculated FCC error between the charge states of around 100% and around 0%. If correction is performed with the estimated FCC error FCCerr used as is as the correction amount, the corrected estimate value FCC3rd of the full charge capacity might vary greatly with a change in the charge state SOC. For this reason, in the second embodiment, the correction amount for correcting the full charge capacity FCC1st is adjusted in accordance with the remaining capacity of the battery.

Figure 11:
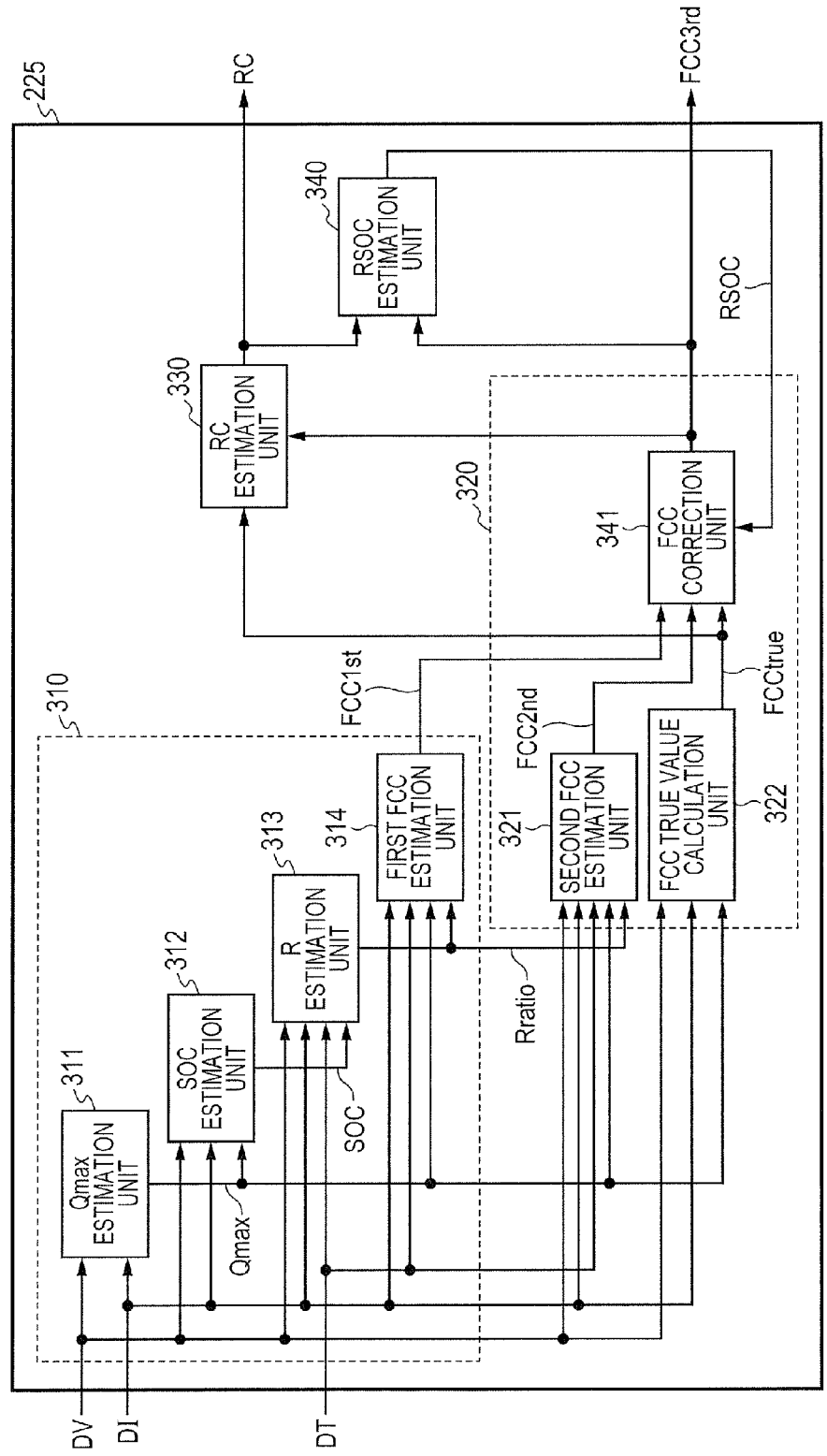
FIG. 11 is a diagram illustrating the internal configuration of a data processing control unit 225 according to a second embodiment.

FIG. 11 illustrates the internal configuration of a data processing control unit 225 in a semiconductor device according to the second embodiment. The data processing control unit 225 further has an RSOC estimation unit 340 in addition to the configuration of the data processing control unit 125 according to the first embodiment. Further, an FCC correction unit 341 in the data processing control unit 225 has the function of adjusting the correction amount in accordance with the output of the RSOC estimation unit 340 in addition to the function of the FCC correction unit 323 in the data processing control unit 125. The other configuration is the same as in the first embodiment. In the semiconductor device according to the second embodiment, the same components as those of the semiconductor device 120 according to the first embodiment are denoted by the same reference numerals, and detailed description thereof is omitted.

The RSOC estimation unit 340 calculates a remaining capacity ratio RSOC (Relative State of Charge) based on the full charge capacity FCC3rd which is the output of the FCC correction unit 341 and the remaining capacity RC which is the output of the RC estimation unit 330. The remaining capacity ratio RSOC is information indicating the charge state in the range from the capacity of 100% in the full charge state to the capacity (e.g., SOC2 in FIG. 7) of 0% when the voltage of the assembled battery 110 reaches the lower limit voltage. The RSOC estimation unit 340 calculates the remaining capacity ratio RSOC, for example, by the following equation (17).

$$RSOC = 100 \times \frac{RC}{FCC3rd} \quad (17)$$

The FCC correction unit 341 adjusts the correction amount for correcting the full charge capacity FCC1st based on the remaining capacity ratio RSOC which is the output of the RSOC estimation unit 340. For example, the FCC correction unit 341 performs adjustment so as to increase the correction amount of the estimate value FCC1st of the full charge capacity calculated by the first FCC estimation unit 314 with a decrease in the charge state SOC. According thereto, consideration is given to smaller remaining capacity RC where the full charge capacity FCC needs to be more accurate. More specifically, the RSOC estimation unit 340 corrects the estimate value FCC1st of the full charge capacity in accordance with the following equation (18), and generates the corrected estimate value FCC3rd of the full charge capacity.

$$FCC3rd = FCC1st - W \times FCCerr \quad (18)$$

In the equation (18), W is an adjustment factor determined in accordance with the remaining capacity ratio RSOC. For example, a function or table indicating the relationship between the remaining capacity ratio RSOC and the adjustment factor W of the correction amount is stored beforehand in the storage unit 124, and the FCC correction unit 341 refers to the function or table based on the remaining capacity ratio RSOC outputted from the RSOC estimation unit 340, and reads the corresponding adjustment factor W. The FCC correction unit 341 generates the corrected estimate value FCC3rd of the full charge capacity based on the read adjustment factor W, the estimate value FCC1st of the full charge capacity, and the FCC error FCCerr.

FIG. 12 shows an example of the function indicating the relationship between the remaining capacity ratio RSOC and the adjustment factor W of the correction amount, in which the adjustment factor W ranges from "0" to "1" in the range of the remaining capacity ratio RSOC from 100% to 0%. According to this, the adjustment is performed so that the correction amount increases as the remaining capacity of the battery decreases.

As described above, according to the data processing control unit 225 of the second embodiment, it is possible to adjust the correction amount of the estimate value FCC1st of the full charge capacity if there is a difference in the magnitude of the FCC error, depending on the remaining capacity of the battery, thus making it possible to further improve the calculation accuracy of the full charge capacity FCC. In particular, as described above, the adjustment is performed so that the adjustment factor W increases in the state of the small remaining capacity of the battery (e.g., small RSOC), thereby making it possible to largely correct the estimate value FCC1st of the full charge capacity in the state of the small remaining capacity of the battery and suppress the correction amount in the state of the larger remaining capacity of the battery, which can improve the stability of the corrected estimate value FCC3rd of the full charge capacity.

While the invention made above by the present inventors has been described specifically based on the illustrated embodiments, the present invention is not limited thereto. It is needless to say that various changes and modifications can be made thereto without departing from the spirit and scope of the invention.

For example, all or some of the function units for implementing the operation processing for battery state detection in the data processing control units 125, 225 and all or some of the function units and processing units in the battery pack 100 can be implemented, for example, by hardware by designing them with integrated circuits or by software by a processor's executing programs for implementing respective functions. Information such as the programs for implementing the functions, functions and tables can be stored in a storage device such as a memory and a hard disk or a storage medium such as an IC card and a DVD.

While, in the first and second embodiments, the assembled battery 110 is configured by series/parallel-coupling lithium-ion cells, a single lithium-ion cell may be used, or only parallel coupling or series coupling may be formed. Further, other cells than the lithium-ion cell can be used.

By packaging the assembled battery 110 and the semiconductor device 120 in one case, it is possible to implement a battery pack used as a power source for a notebook computer or the like. By packaging the semiconductor device 120 and the display unit 200 in one case and making only the assembled battery 110 replaceable, it is possible to implement the configuration of a mobile terminal such as a smartphone and a cell phone. Further, there may be adopted a configuration in which the assembled battery 110, the semiconductor device 120, and the display unit 200 are integrated, disabling partial exchange. Further, there can be adopted a configuration in which the assembled battery 110, the semiconductor device 120, and the display unit 200 are packaged in respective independent cases, making them individually replaceable.

While the first and second embodiments illustrate the configuration of the selection unit 121 for switching among the four cell groups 112 and the temperature detection unit 130, the invention is not limited thereto. For example, in the case where state detection is performed on a single cell 111 or cell group 112, the selection unit 121 may switch between the cell 111 or cell group 112 and the temperature detection unit 130. Further, in the case where the temperature detection unit 130 is not mounted, both ends of the cell 111 or cell group 112 may be directly coupled to the input of the voltage measurement unit 122, excluding the selection unit 121. In the case where a plurality of temperature detection units 130 are mounted, the selection unit 121 can select among the respective outputs of the temperature detection units 130.

While the first and second embodiments illustrate the configuration in which the voltage measurement unit 122 and the current measurement unit 123 are provided separately, there may be adopted a configuration in which the voltage information of the cell group 112, the voltage information of the temperature detection unit 130, and the voltage information of the current detection unit 140 are measured by dedicated voltage measurement units respectively, or there may be adopted a configuration in which one voltage measurement unit measures all the voltage information.

While the example of the discharge of the cell has been described with reference to FIG. 6 as a method for calculating the capacity Qmax, it is possible to calculate the capacity Qmax by the same procedure in the case of charging the cell as well. Further, if there is a difference in the charge state SOC between before and after the charge/discharge, it is possible to calculate the capacity Qmax in the same way even in the case of the mixture of charge and discharge of the battery. However, for execution of processing by the Qmax estimation unit 311, it is necessary to obtain the voltage OCV after the battery pauses for more than a predetermined time after the stop of the battery charge/discharge; therefore, it is not possible to update the capacity Qmax in real time during the use of the battery pack 100. It is possible to obtain the capacity Qmax after the battery pauses for more than the predetermined time after the use of the battery pack 100.

While the first and second embodiments illustrate the case of obtaining the average Qmax of the assembled battery 110 to facilitate understanding, it is also possible to estimate the capacity Qmax for each cell group 112 based on voltage information for each cell group 112. For example, if the voltage value used by the SOC estimation unit 312 is the value for each cell group 112 as in the operation processing by the Qmax estimation unit 311, it is possible to obtain the charge state SOC for each cell group 112 (in this case, Qmax from the Qmax estimation unit 311 needs to use the value for each cell group 112).

While the second embodiment illustrates the function in which the adjustment factor W varies from "0" to "1" at a constant slope with a decrease in the remaining capacity ratio RSOC as an example of the function indicating the relationship between the remaining capacity ratio RSOC and the adjustment factor W of the correction amount as shown in FIG. 12, it is also possible to implement an adjustment factor table whose slope varies with a decrease in the remaining capacity ratio RSOC. Further, it is possible to adopt a stepwise function or table in which the adjustment factor W is "0" if the remaining capacity ratio RSOC is larger than a predetermined threshold value, and "1" if the remaining capacity ratio RSOC is smaller than a predetermined threshold value. Further, there may be adopted a function or table in which the direction of change of the adjustment factor W changes in accordance with the remaining capacity ratio RSOC. For example, there may be adopted a function or table in which the adjustment factor W varies in the direction from "0" to "1" with a decrease in RSOC in a predetermined range of the remaining capacity ratio RSOC and the adjustment factor W varies in the direction from "1" to "0" with a decrease in RSOC in the other range. This enables flexible control for switching between correction and no correction or the degrees of correction in accordance with the remaining capacity of the battery.

What is claimed is:

1. A semiconductor device for monitoring a state of a battery, the semiconductor device comprising:
a voltage measurement unit for measuring a voltage of the battery;
a current measurement unit for measuring a current of the battery; and
a data processing control unit for generating state information indicating the state of the battery, based on measurement results of the voltage measurement unit and the current measurement unit,
wherein the data processing control unit calculates a first estimate value of a capacity that can be extracted from the battery in the case of discharging the battery from a full charge state until a discharge cutoff voltage at a predetermined discharge rate and a second estimate value of a capacity that can be extracted from the battery in the case of discharging the battery until a voltage larger than the discharge cutoff voltage, and corrects the first estimate value based on an error in the second estimate value,
wherein the error in the second estimate value is determined based on a difference amount between a capacity value extracted from the battery by discharging the battery from the full charge state until the voltage larger than the discharge cutoff voltage and the second estimate value.

2. The semiconductor device according to claim 1,
wherein the data processing control unit calculates the capacity value extracted from the battery, based on an integrated value of a discharge current in the case of discharging the battery until the voltage larger than the discharge cutoff voltage.

3. The semiconductor device according to claim 2,
wherein the data processing control unit performs a plurality of processes for correcting the first estimate value based on the error in the second estimate value.

4. The semiconductor device according to claim 2,
wherein the data processing control unit adjusts a correction amount for correcting the first estimate value based on the error in the second estimate value, in accordance with a remaining capacity of the battery.

5. The semiconductor device according to claim 4,
wherein the data processing control unit performs adjustment so as to increase the correction amount with a decrease in the remaining capacity of the battery.

6. The semiconductor device according to claim 2,
wherein the data processing control unit comprises
a first operation unit for calculating the first estimate value based on an estimate value of a total capacity of the battery in the full charge state and an estimate value of a charge state of the battery corresponding to the discharge cutoff voltage in the case of discharging the battery at the predetermined discharge rate,
a second operation unit for calculating the second estimate value based on the estimate value of the total capacity of the battery and an estimate value of a charge state of the battery corresponding to the voltage larger than the discharge cutoff voltage in the case of discharging the battery at the predetermined discharge rate,
a third operation unit for calculating the capacity value extracted from the battery by discharging the battery from the full charge state until the voltage larger than the discharge cutoff voltage, based on the integrated value of the discharge current in the case of discharging the battery until the voltage larger than the discharge cutoff voltage, and
a fourth operation unit for calculating a difference between the second estimate value calculated by the second operation unit and the capacity value calculated by the third operation unit, correcting the first estimate value based on the difference, and generating a third estimate value.

7. The semiconductor device according to claim 6,
wherein the third operation unit calculates the capacity value extracted from the battery by adding the integrated value of the discharge current from when the current measurement unit starts measuring the discharge current of the battery until when the voltage of the battery reaches the voltage larger than the discharge cutoff voltage to a capacity value lost from the battery during a period from the full charge state until the start of measurement of the discharge current.

8. The semiconductor device according to claim 7,
wherein the data processing control unit further comprises a fifth operation unit for generating first remaining capacity information indicating a remaining capacity of the battery by subtracting the capacity value calculated by the third operation unit from the third estimate value calculated by the fourth operation unit.

9. The semiconductor device according to claim 8,
wherein the data processing control unit further comprises a sixth operation unit for calculating second remaining capacity information indicating a ratio of the operation result to the third estimate value,
wherein the fourth operation unit adjusts a correction amount for correcting the first estimate value based on the second remaining capacity information calculated by the sixth operation unit.

10. A battery pack comprising:
a secondary battery comprised of single or multiple cells, and
the semiconductor device according to claim 1 for monitoring a state of the secondary battery.

11. An electronic device comprising:
the battery pack according to claim 10, and
an internal circuit which can operate with power supplied from the secondary battery.

12. The electronic device according to claim 11, further comprising a display unit which can display information of the secondary battery based on the state information generated by the semiconductor device.

13. An electronic device comprising:
an internal circuit which can operate with power supplied from a battery;
the semiconductor device according to claim 1 for monitoring a state of the battery, and
a display unit which can display information of the battery based on the state information generated by the semiconductor device.

* * * * *